United States Patent
Suh et al.

(10) Patent No.: US 10,361,202 B2
(45) Date of Patent: Jul. 23, 2019

(54) MULTIGATE METAL-OXIDE SEMICONDUCTOR FIELD EFFECT TRANSISTOR

(71) Applicant: SAMSUNG ELECTRONICS CO., LTD., Suwon-si, Gyeonggi-do (KR)

(72) Inventors: Dong-chan Suh, Suwon-si (KR); Gi-gwan Park, Hwaseong-si (KR); Dong-woo Kim, Incheon (KR); Dong-suk Shin, Yongin-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 13 days.

(21) Appl. No.: 15/611,893

(22) Filed: Jun. 2, 2017

(65) Prior Publication Data

US 2017/0365604 A1 Dec. 21, 2017

(30) Foreign Application Priority Data

Jun. 21, 2016 (KR) ........................ 10-2016-0077545

(51) Int. Cl.
| | |
|---|---|
| *H01L 29/66* | (2006.01) |
| *H01L 27/092* | (2006.01) |
| *H01L 21/8238* | (2006.01) |
| *H01L 29/165* | (2006.01) |
| *H01L 29/04* | (2006.01) |
| *H01L 29/06* | (2006.01) |

(52) U.S. Cl.
CPC .. *H01L 27/0924* (2013.01); *H01L 21/823814* (2013.01); *H01L 21/823821* (2013.01); *H01L 21/823878* (2013.01); *H01L 29/045* (2013.01); *H01L 29/0665* (2013.01); *H01L 29/165* (2013.01); *H01L 29/6656* (2013.01); *H01L 29/66545* (2013.01)

(58) Field of Classification Search
CPC ..... H01L 21/823878; H01L 21/823814; H01L 21/823821; H01L 29/0665; H01L 29/045; H01L 29/66545; H01L 29/6656; H01L 29/165
See application file for complete search history.

(56) References Cited

U.S. PATENT DOCUMENTS

| | | |
|---|---|---|
| 7,202,117 B2 | 4/2007 | Orlowski |
| 7,795,677 B2 | 9/2010 | Bangsaruntip et al. |
| 8,384,065 B2 | 2/2013 | Bangsaruntip et al. |

(Continued)

*Primary Examiner* — Kyoung Lee
*Assistant Examiner* — Christina Sylvia
(74) *Attorney, Agent, or Firm* — Lee & Morse, P.C.

(57) ABSTRACT

A semiconductor device includes a substrate including a first region and a second region, fin type active areas extending in a first direction away from the substrate in each of the first and second regions, a plurality of nanosheets extending parallel to an upper surface of the fin type active areas and being spaced apart from the upper surface of the fin type active areas, a gate extending over the fin type active areas in a second direction crossing the first direction, a gate dielectric layer interposed between the gate and each of the nanosheets, first source and drain regions included in the first region and second source and drain regions included in the second region, and insulating spacers interposed between the fin type active areas and the nanosheets, wherein air spacers are interposed between the insulating spacers and the first source and drain regions.

19 Claims, 57 Drawing Sheets

(56) References Cited

U.S. PATENT DOCUMENTS

| | | |
|---|---|---|
| 8,921,825 B2 | 12/2014 | Bangsaruntip et al. |
| 8,987,794 B2 | 3/2015 | Rachmady et al. |
| 9,024,364 B2 | 5/2015 | Okano |
| 9,029,834 B2 | 5/2015 | Bangsaruntip et al. |
| 9,184,269 B2 | 11/2015 | Ching et al. |
| 9,257,527 B2 | 2/2016 | Hashemi et al. |
| 9,276,064 B1* | 3/2016 | Zang ............... H01L 29/0673 |
| 9,905,643 B1* | 2/2018 | Bergendahl ......... H01L 29/0673 |
| 2009/0184341 A1 | 7/2009 | Chong et al. |
| 2011/0175166 A1* | 7/2011 | Bedell ................ H01L 21/845 |
| | | 257/351 |
| 2017/0069763 A1* | 3/2017 | Doris ................ H01L 21/0228 |
| 2017/0110554 A1* | 4/2017 | Tak .................. H01L 29/4991 |
| 2018/0097059 A1* | 4/2018 | Bi ..................... H01L 29/0649 |

* cited by examiner

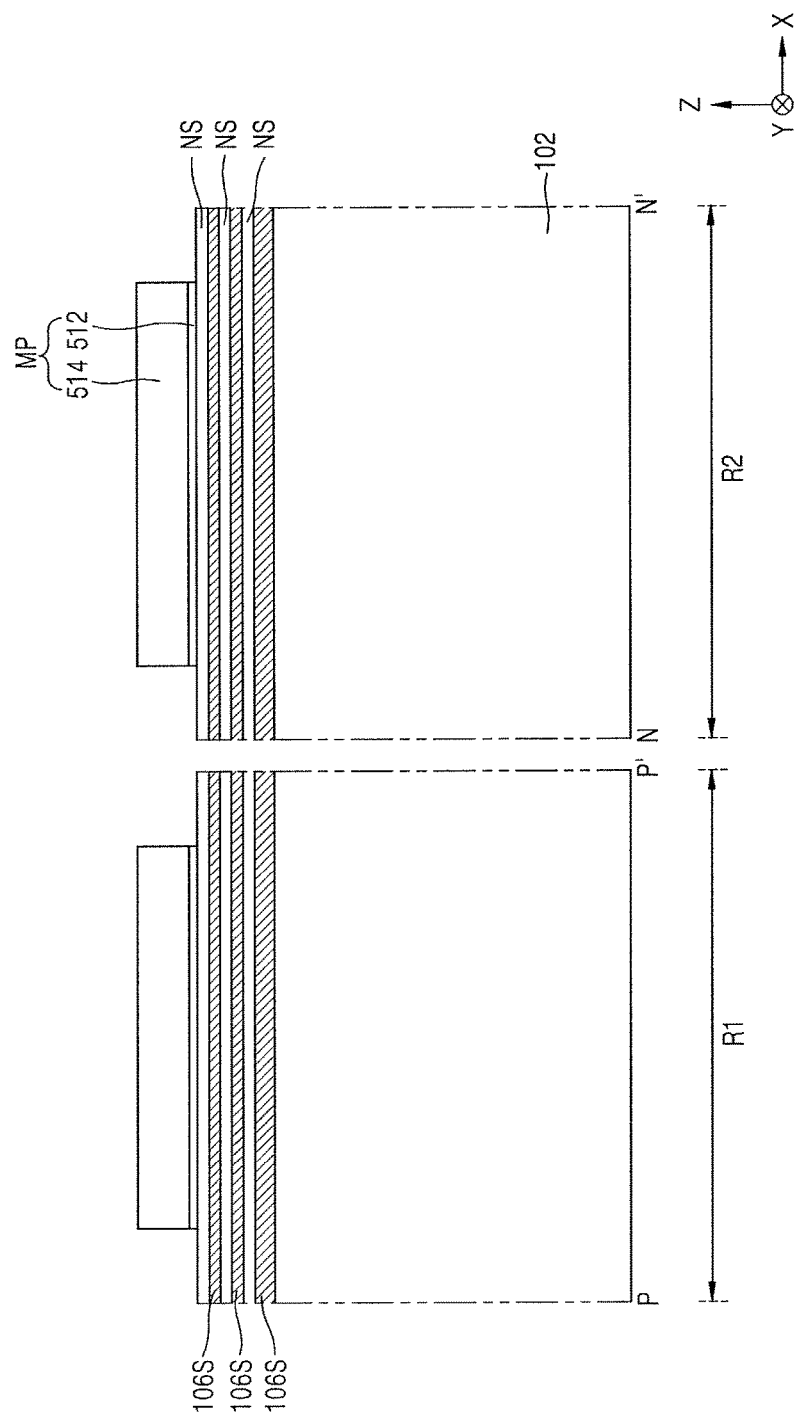

MULTIGATE METAL-OXIDE SEMICONDUCTOR FIELD EFFECT TRANSISTOR

CROSS-REFERENCE TO RELATED APPLICATION

Korean Patent Application No. 10-2016-0077545, filed on Jun. 21, 2016, in the Korean Intellectual Property Office, and entitled: "Semiconductor Device," is incorporated by reference herein in its entirety.

BACKGROUND

1. Field

Embodiments relate to a semiconductor device, and more particularly, to a semiconductor device including a multigate metal-oxide-semiconductor field effect transistor (MOSFET).

2. Description of the Related Art

As the integration degree of a semiconductor device increases, semiconductor devices have been reduced in size to an extreme state, and scaling limits are being pushed.

SUMMARY

Embodiments are directed to a semiconductor device, including a substrate including a first region and a second region, fin type active areas extending in a first direction away from the substrate, the fin type active areas being included in each of the first and second regions, a plurality of nanosheets extending parallel to an upper surface of the fin type active areas and being spaced apart from the upper surface of the fin type active areas, each of the nanosheets having a channel region, a gate extending over the fin type active areas in a second direction crossing the first direction, wherein the gate surrounds at least a portion of each of the nanosheets, a gate dielectric layer interposed between the nanosheets and the gate, first source and drain regions included in the first region and second source and drain regions included in the second region, the first source and drain regions and the second source and drain regions being connected to the nanosheets and respectively including materials different from one another, and insulating spacers interposed between the fin type active areas and the nanosheets, wherein air spacers are interposed between the insulating spacers and the first source and drain regions in the first region.

Embodiments are also directed to a semiconductor device, including a substrate including active areas in each of first and second regions, at least one of nanosheet stack structures facing upper surfaces of the active areas and being spaced apart from the upper surfaces of the active areas, the at least one nanosheet stack structures including a plurality of nanosheets each having a channel region, a gate extending over the active areas in a direction crossing the active areas and covering the at least one nanosheet stack structure, wherein the gate includes a main gate portion disposed over the at least one nanosheet stack structure and a plurality of sub-gate portions disposed under each of the plurality of nanosheets, a gate dielectric layer interposed between the at least one nanosheet stack structure and the gate, first source and drain regions included in the first region and second source and drain regions included in the second region, the first source and drain regions and the second source and drain regions being connected to the nanosheets, a first insulating spacer disposed on the plurality of nanosheets, the first insulating spacer covering sidewalls of the gate, and a plurality of second insulating spacers interposed between the sub-gate portions and the first source and drain regions in spaces between the upper surfaces of the active areas and the at least one nanosheet stack structure and spaces between the plurality of nanosheets in the first region and interposed between the sub-gate portions and the second source and drain regions in spaces between the upper surfaces of the active areas and the at least one nanosheet stack structure and the spaces between the plurality of nanosheets in the second region, wherein air spacers are interposed between the second insulating spacers and the first source and drain regions in the first region, and the second insulating spacers contact the second source and drain regions in the second region.

Embodiments are also directed to a semiconductor device, including a substrate including a first region and a second region adjacent to each other, a first nanosheet stack structure in the first region, and a second nanosheet stack structure in the second region, the first and second nanosheet structures each including a lowermost nanosheet coplanar with one another, a metal or metal nitride conductive layer on the lowermost nanosheet, and a second nanosheet on the conductive layer, the second nanosheet having a width greater than that of the conductive layer such that the second nanosheet overhangs the conductive layer to form a recess, first source and drain regions disposed on opposite sides of the first nanosheet stack structure, second source and drain regions disposed on opposite sides of the second nanosheet stack structure, insulating spacers disposed in the recesses of the first and second nanosheet stack structures, the insulating spacers in the recesses of the second nanosheet stack structure contacting the second source and drain regions, and the insulating spacers in the recesses of the first nanosheet stack structure being separated from the first source and drain regions by an air gap.

BRIEF DESCRIPTION OF THE DRAWINGS

Features will become apparent to those of skill in the art by describing in detail example embodiments with reference to the attached drawings in which.

DETAILED DESCRIPTION

Figure 1:
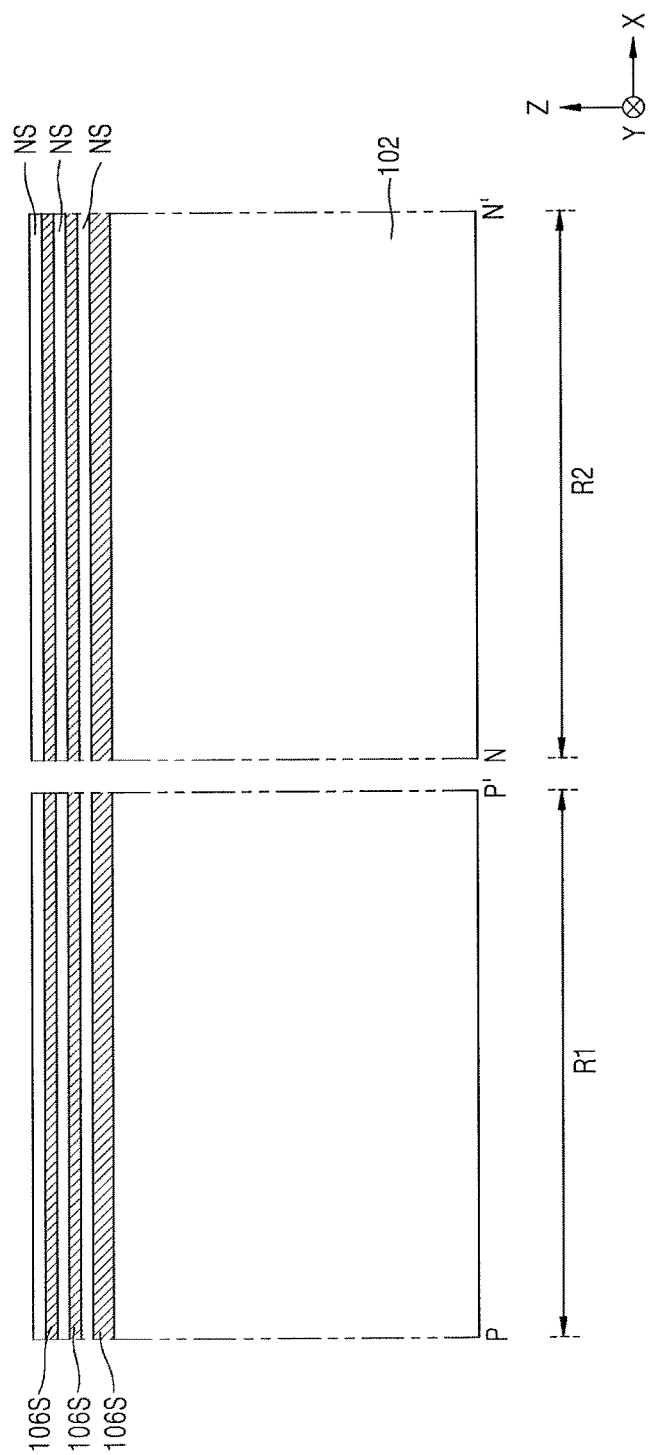
FIGS. 1 through 23 illustrate cross-sectional views describing a method of manufacturing a semiconductor device based on a process order, according to example embodiments.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

FIGS. 1 through 23 are cross-sectional views describing a method of manufacturing a semiconductor device based on a process order, according to example embodiments. In more detail, FIG. 1, FIG. 2A, FIG. 3A, FIG. 4A, FIG. 5A, FIG. 6A, FIG. 7A, FIGS. 8 through 14, and FIGS. 16 through 23 are respective cross-sectional views of portions corresponding to cross-sections taken along line P-P' and line N-N' of FIG. 25A. FIG. 2B, FIG. 3B, FIG. 4B, FIG. 5B, FIG. 6B and FIG. 7B are cross-sectional views of portions corresponding to a cross-section taken along line Y-Y' of FIG. 25A. FIGS. 15A through 15E are enlarged sectional views of portions corresponding to a region P1 of FIG. 14.

Referring to FIG. 1, a plurality of sacrificial semiconductor layers 106S and a plurality of nanosheet semiconductor layers NS may be alternately stacked in a stack structure on a substrate 102 including a first region R1 and a second region R2. In some embodiments, a complementary metal oxide silicon (CMOS) device may be formed by forming a p-channel metal-oxide-semiconductor (PMOS) transistor in the first region R1 of the substrate 102 and by forming an n-channel metal-oxide-semiconductor (NMOS) in the second region R2 of the substrate 102, but is not limited thereto.

The substrate 102 may include a semiconductor such as silicon (Si) and germanium (Ge), or a compound semiconductor such as silicon-germanium (SiGe), silicon carbide (SiC), gallium arsenide (GaAs), indium arsenide (InAs), and indium phosphide (InP). In some embodiments, the substrate 102 may include at least one of a group III-V material and a group IV material. The group III-V material may include a binary, a trinary, or a quaternary compound including at least one group III element and at least one group V element. The group III-V material may be a compound including at least one element of indium (In), gallium (Ga), and aluminum (Al), as the group III element and at least one element of arsenic (As), phosphorus (P), and antimony (Sb) as the group V element. For example, the group III-V material may be selected from InP, $In_zGa_{1-z}As$ ($0 \le z \le 1$), and $Al_zGa_{1-z}As$ ($0 \le z \le 1$). The binary compound may be one of, for example, InP, GaAs, InAs, indium antimonide (InSb) and gallium antimonide (GaSb). The trinary compound may be one of InGaP, InGaAs, aluminum-indium-arsenide (AlInAs), InGaSb, GaAsSb and GaAsP. The group IV material may be Si or Ge. However, the example embodiments are not limited to the above examples of the group III-V material and the group IV material. The group III-V material and the group IV material such as Ge may be used as channel materials for forming a transistor having low power consumption and a high operating speed. A high performance CMOS may be fabricated by using a semiconductor substrate including the group III-V material, e.g., GaAs, having a higher electron mobility than that of an Si substrate, and a semiconductor substrate having a semiconductor material, e.g., Ge, having a higher hole mobility than that of the Si substrate. In some embodiments, when an NMOS transistor is formed on the substrate 102, the substrate 102 may include one of the group III-V materials explained above. In some other embodiments, when a PMOS transistor is formed on the substrate 102, at least a part of the substrate 102 may include Ge. In other embodiments, the substrate 102 may have a silicon-on-insulator (SOI) structure. The substrate 102 may include a conductive area, for example, a well doped with impurities or a structure doped with impurities.

The sacrificial semiconductor layers 106S and the nanosheet semiconductor layers NS may include different semiconductor materials, respectively. In some embodiments, the nanosheets NS may include a single material. In some embodiments, the nanosheets NS may be formed of the same material as that of the substrate 102.

In some embodiments, the sacrificial semiconductor layers 106S may include SiGe, and the nanosheet semiconductor layers NS may include Si but the inventive concept is not limited thereto.

A thickness of the sacrificial semiconductor layer 106S that is the closest to the substrate 102 among the plurality of sacrificial semiconductor layers 106S may be greater than thicknesses of the other sacrificial semiconductor layers 106S but is not limited thereto. For example, the sacrificial semiconductor layers 106S may include the same thickness.

Figure 2B:
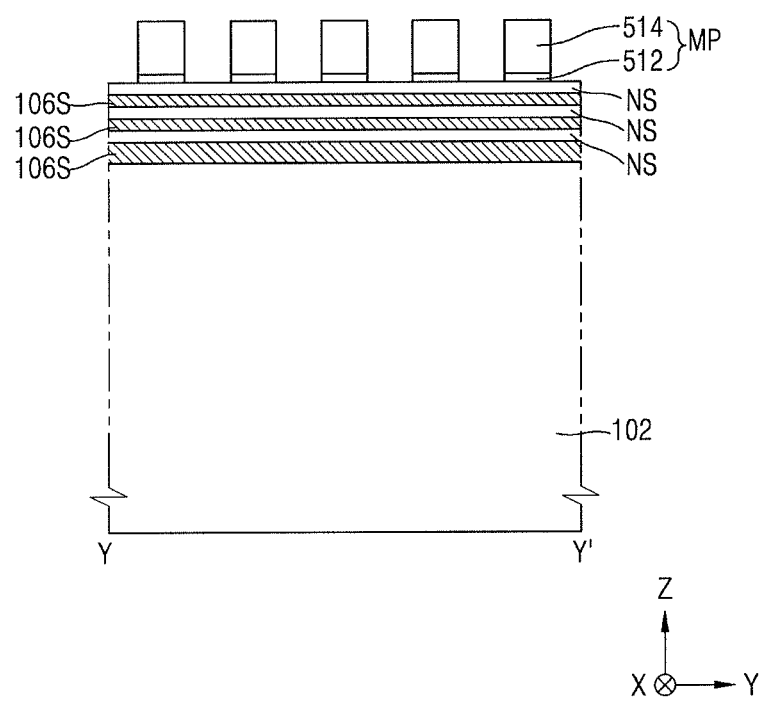

Referring to FIGS. 2A and 2B, a mask pattern MP may be formed on the stack structure of FIG. 1 having the sacrificial semiconductor layers 106S and the nanosheet semiconductor layers NS in each of first and second regions R1 and R2. The mask pattern MP may include a plurality of line patterns extending parallel to each other in one direction (X direction).

The mask pattern MP may include a pad oxide layer pattern 512 and a hard mask pattern 514. The hard mask pattern 514 may include silicon nitride (SiN), polysilicon, a spin-on hardmask (SOH) material, or a combination thereof but is not limited thereto. In some embodiments, the SOH material may include a hydrocarbon compound having a relatively high carbon content ranging from about 85 w % to about 99 w % in relation to the total weight of the SOH material or derivatives thereof.

Figure 3A:
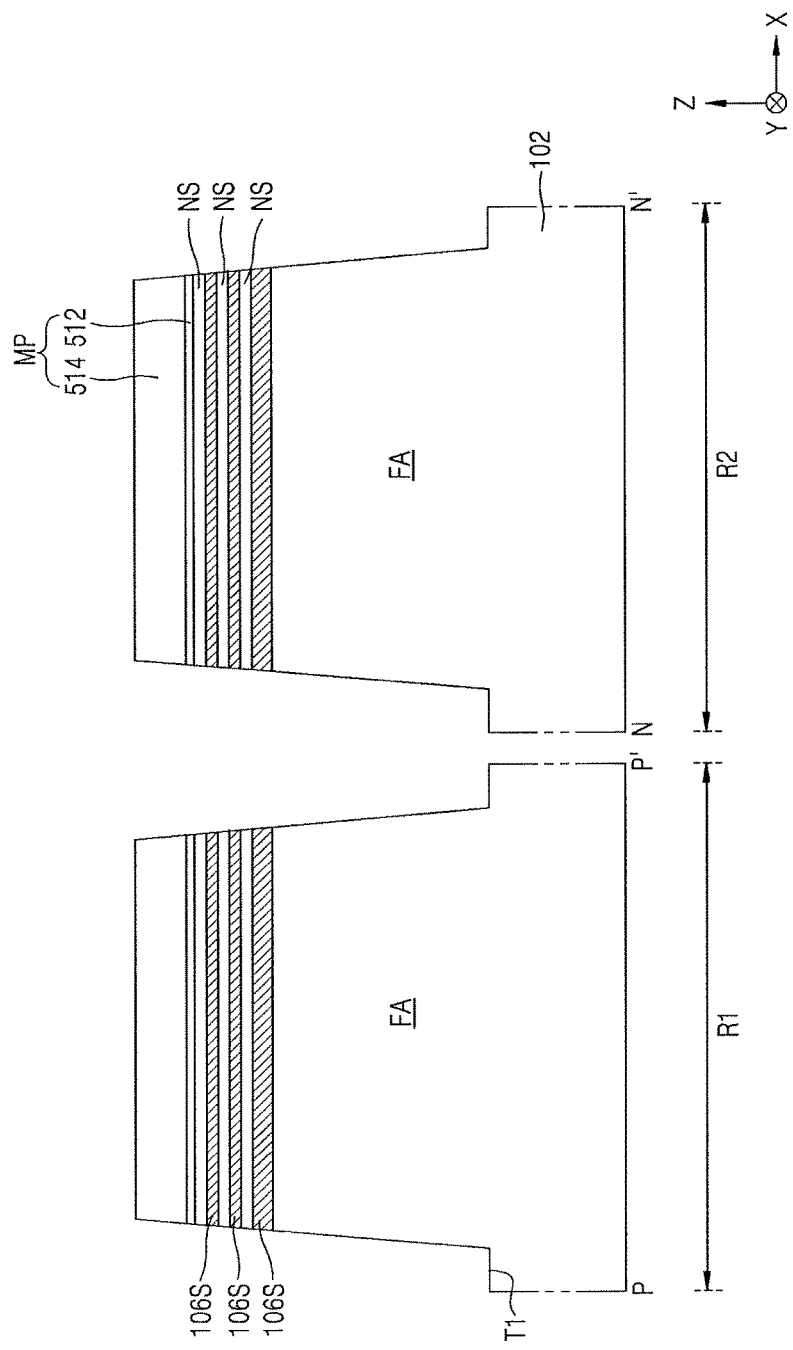
Figure 3B:
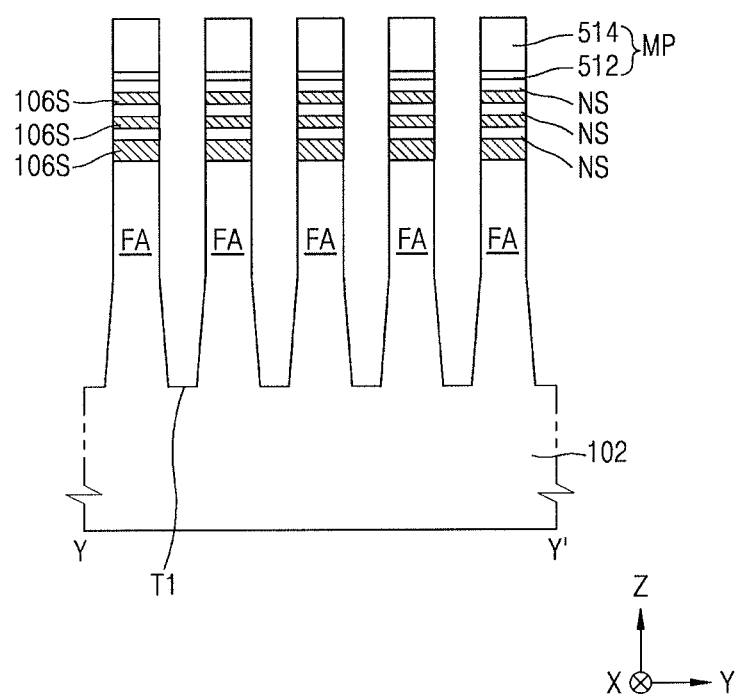

Referring to FIGS. 3A and 3B, the stack structure of the sacrificial semiconductor layers 106S and the nanosheet semiconductor layers NS may be formed by using the mask pattern MP of FIGS. 2A and 2B as an etch mask, and a plurality of first trenches T1 may be formed by etching a part of the substrate 102. As a result, a plurality of fin type active areas FA defined by the plurality of first trenches T1 may be formed.

After the fin type active areas FA are formed, the stack structure of the sacrificial semiconductor layers 106S and the nanosheet semiconductor layers NS may remain on the fin type active areas FA.

Figure 4A:
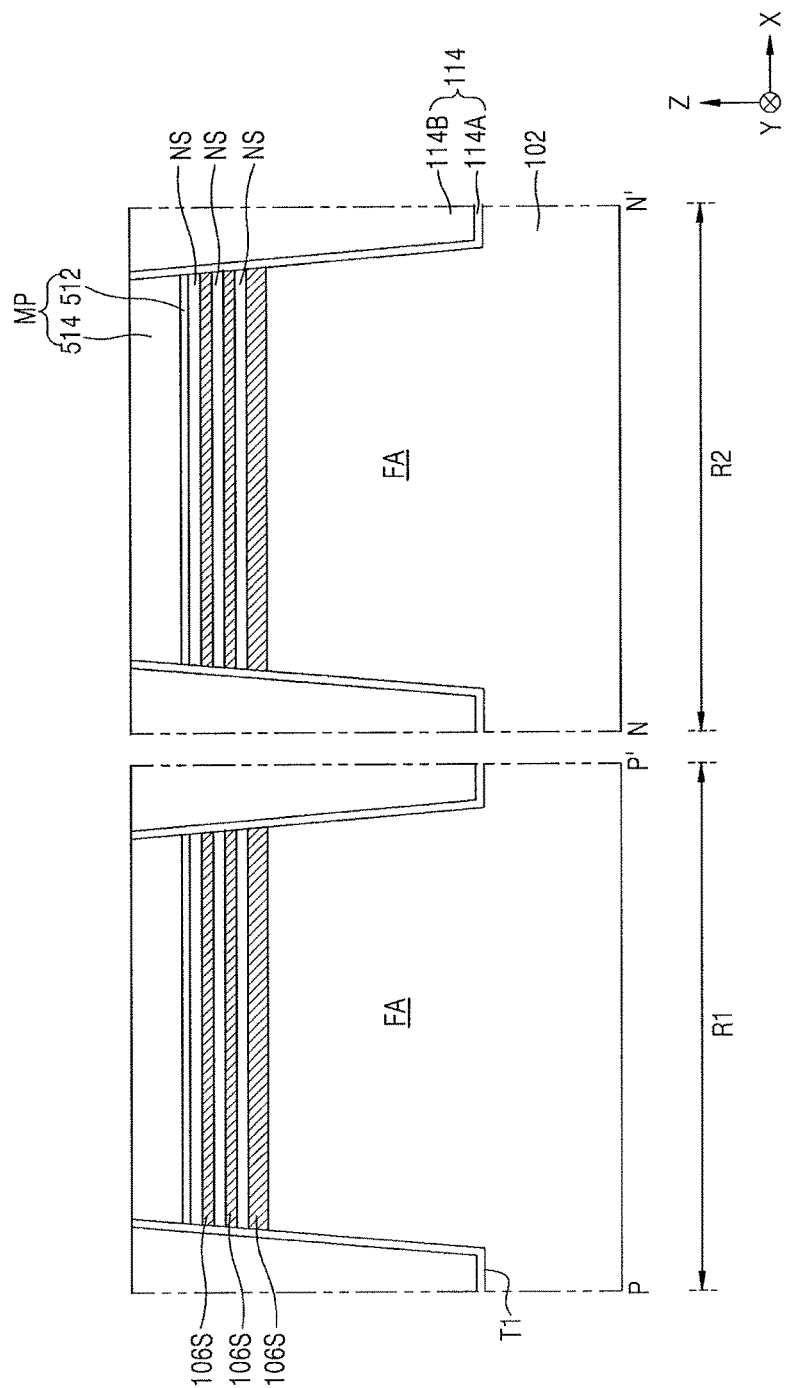
Figure 4B:
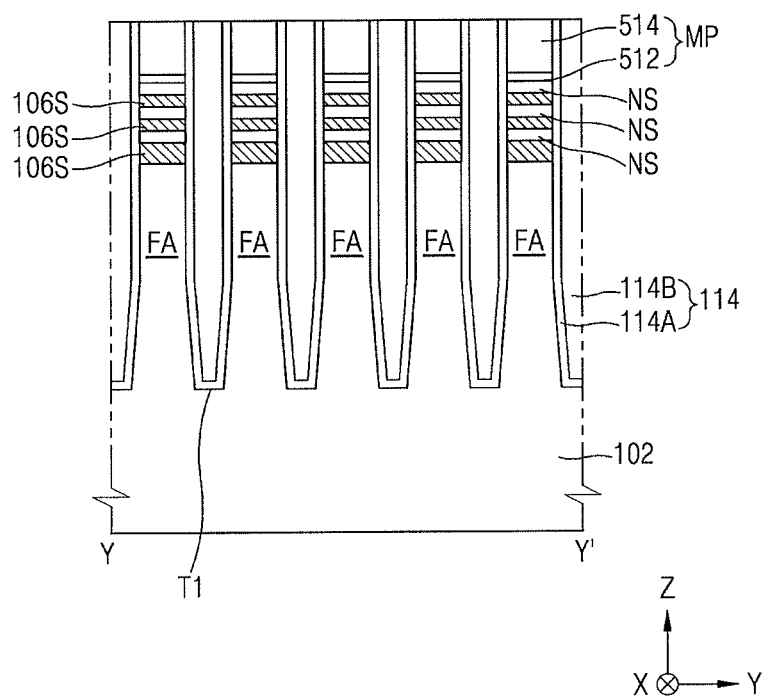

Referring to FIGS. 4A and 4B, a shallow trench isolation (STI) layer 114 may be formed in the first trenches T1 of FIGS. 3A and 3B. The STI layer 114 may include an insulating liner 114A conformally covering an inner wall of the first trench T1 and a gap-fill insulating layer 114B filling the first trench T1 on the insulating liner 114A.

The insulating liner 114A covering the inner wall of the first trench T1 may include an oxide layer, SiN, silicon oxynitride (SiON), silicon boronitride (SiBN), SiC, SiC:H, SiCN, SiCN:H, SiOCN, SiOCN:H, silicon oxycarbide (SiOC), silicon dioxide ($SiO_2$), polysilicon, or a combination thereof. In some embodiments, the insulating liner 114A may have a thickness ranging from about 10 Å to about 100 Å.

In some embodiments, the gap-fill insulating layer 114B may include an oxide layer. In some embodiments, the gap-fill insulating layer 114B may include an oxide layer formed through a deposition process or a coating process. In some embodiments, the gap-fill insulating layer 114B may include an oxide layer formed through a flowable chemical vapor deposition (FCVD) process or a spin coating process. For example, the gap-fill insulating layer 114B may include fluoride silicate glass (FSG), undoped silicate glass (USG), boro-phospho-silicate glass (BPSG), phospho-silicate glass (PSG), flowable oxide (FOX), plasma-enhanced tetra-ethyl-ortho-silicate (PE-TEOS), or tonen silazene (TOSZ), but is not limited thereto.

Figure 5A:
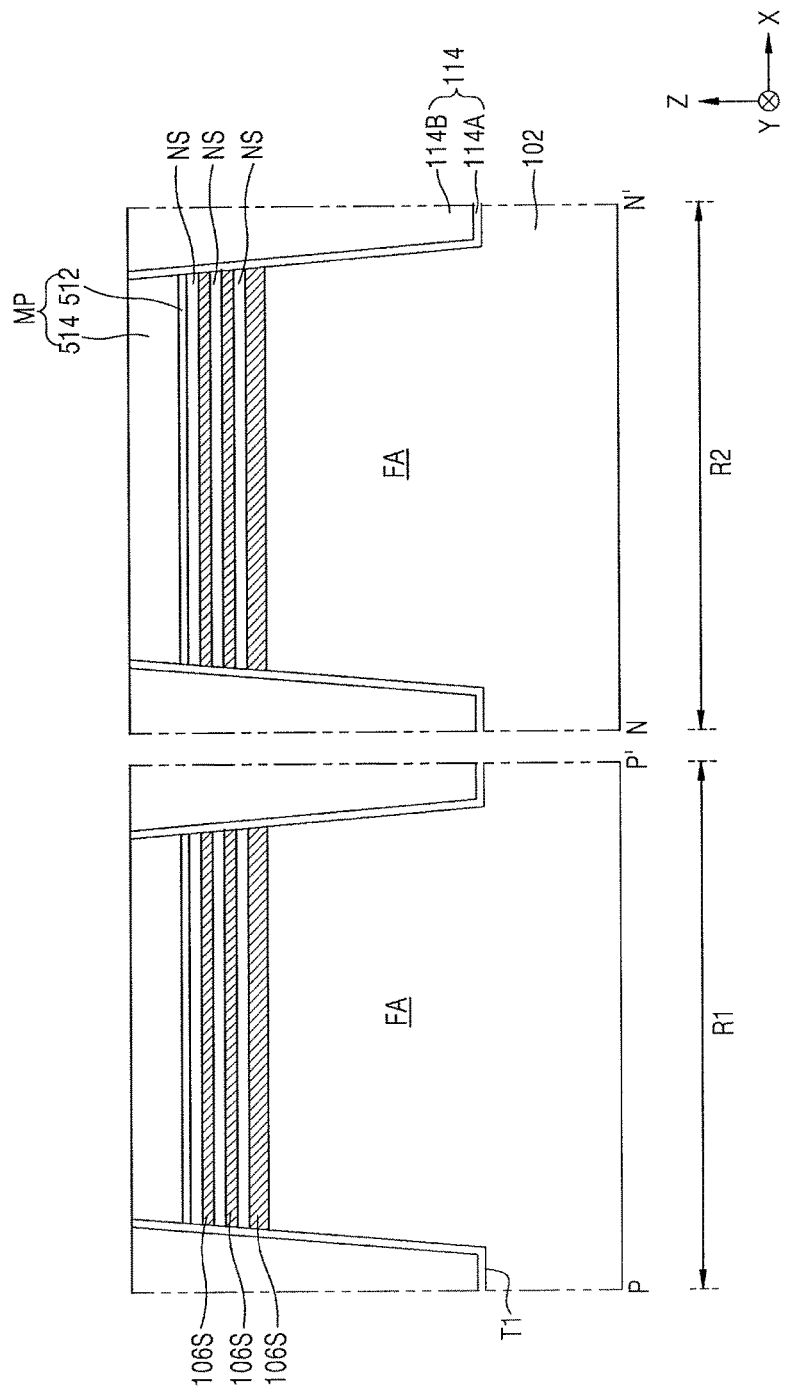
Figure 5B:
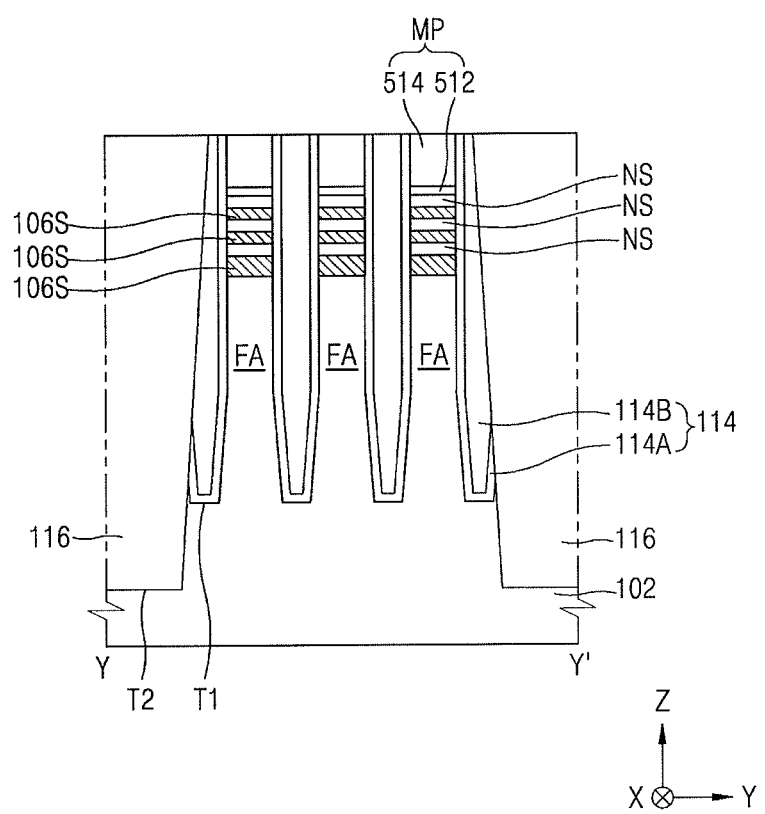

Referring to FIGS. 5A and 5B, a second trench T2 (shown in FIG. 5B) respectively defining first and second device regions DR-P and DR-N (see FIG. 25A) in the first and second regions R1 and R2 may be formed by etching partial structures from a resultant formed from the plurality of fin type active areas FA and the STI layer 114 of FIGS. 4A and 4B. A device isolation layer 116 may be formed in the second trench T2.

The device isolation layer 116 filled in the second trench T2 may include an oxide layer, a nitride layer, or a combination thereof. In some embodiments, the device isolation layer 116 and the gap-fill insulating layer 114B may include the same material.

Figure 6A:
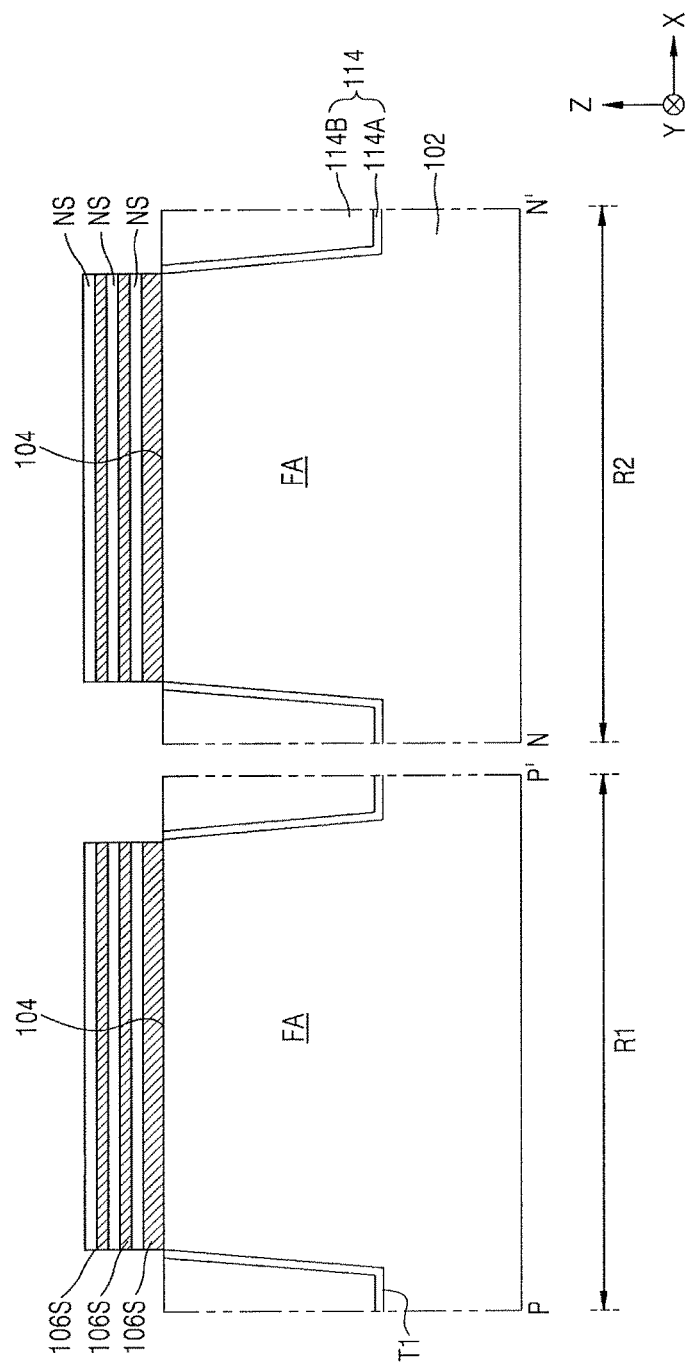
Figure 6B:
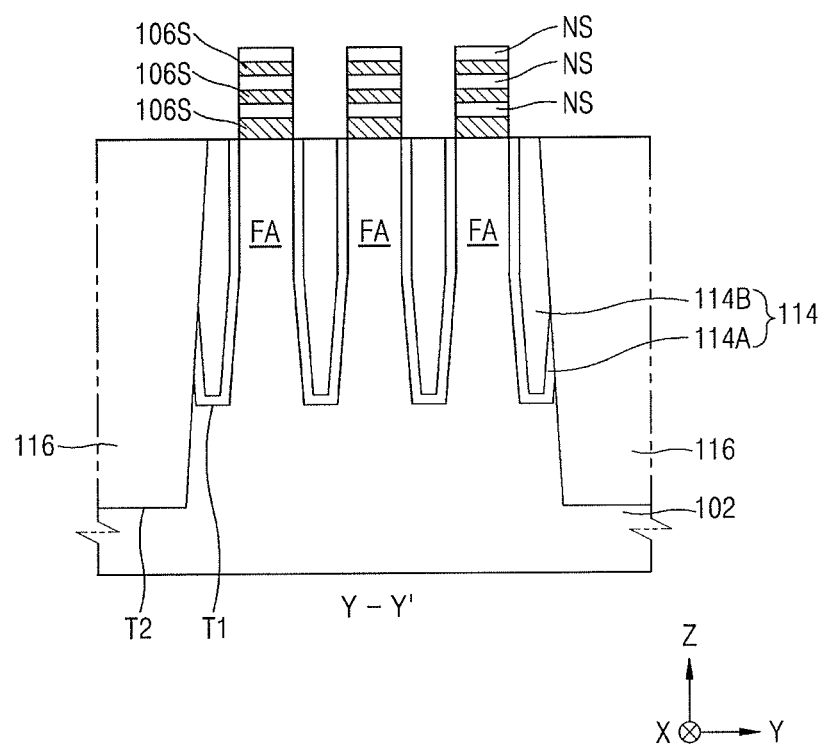

Referring to FIGS. 6A and 6B, the mask pattern MP remaining on the stack structure of the sacrificial semiconductor layers 106S and the nanosheet semiconductor layers NS of FIGS. 5A and 5B may be removed, and a recess process may be performed to remove upper portions of the STI layer 114 and the device isolation layer 116 equal to partial thicknesses thereof.

The recess process may be performed on an upper surface of each of the STI layer 114 and the device isolation layer 116 to be approximately the same as or similar to a level of an upper surface 104 of the fin type active area FA. As a result, side walls of the stack structure of the sacrificial semiconductor layers 106S and the nanosheet semiconductor layers NS present on the fin type active areas FA may be exposed.

Dry etching, wet etching, or a combination of dry etching and wet etching may be used to perform the recess process.

In some embodiments, after the mask pattern MP is removed, before the recess process is performed to remove the upper portions of the STI layer 114 and the device isolation layer 116, an impurity ion injection process for injecting impurity ions for adjusting threshold voltages may be performed on the upper portions of the nanosheet semiconductor layers NS and the fin-type active areas FA. In some embodiments, during the impurity ion injection process for injecting impurity ions for adjusting threshold voltages, phosphorus (P) or arsenide (As) ions may be injected into the first region R1 as impurities, and boron (B) ions may be injected into the second region R2 as impurities.

Figure 7A:
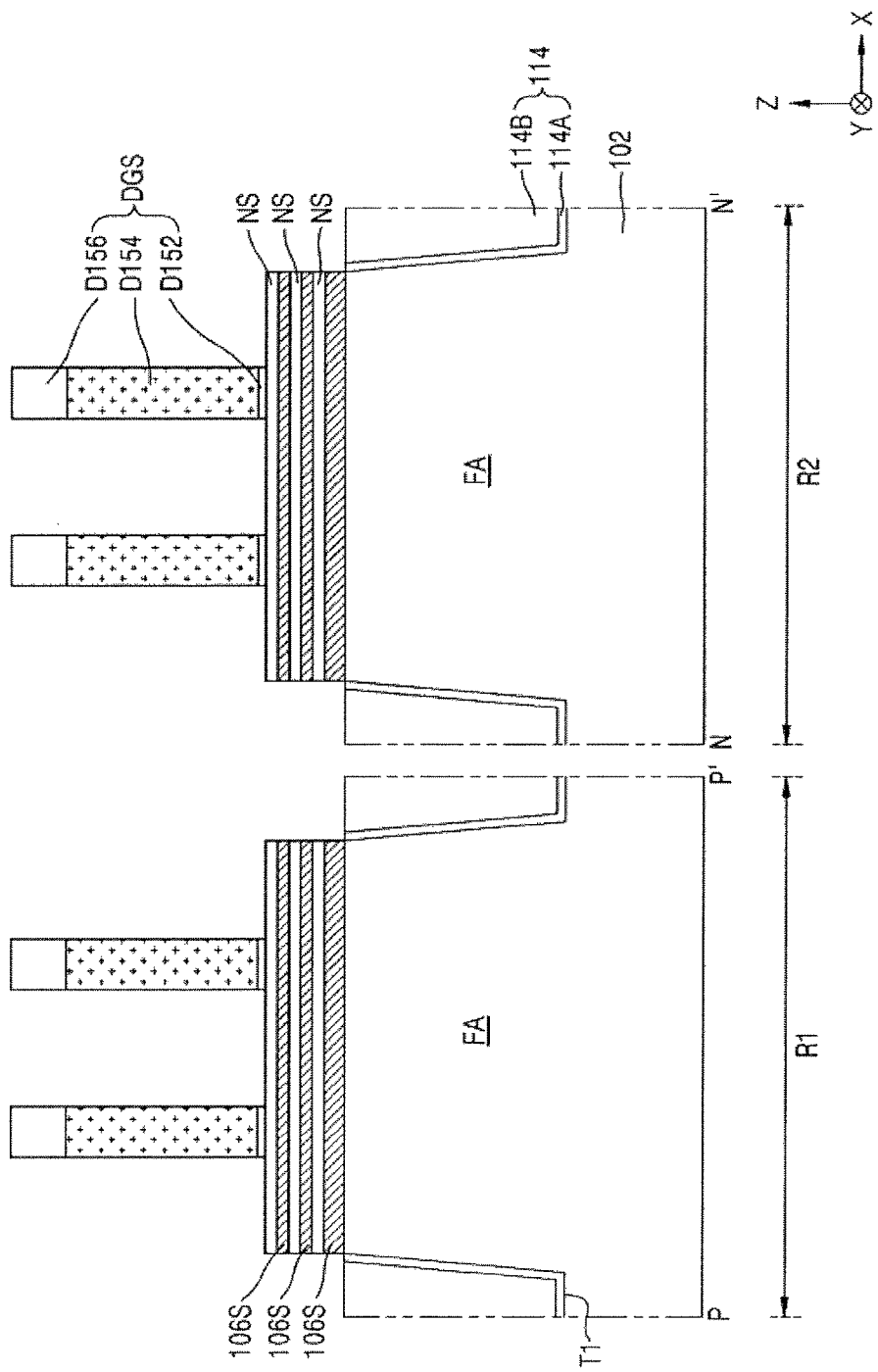
Figure 7B:
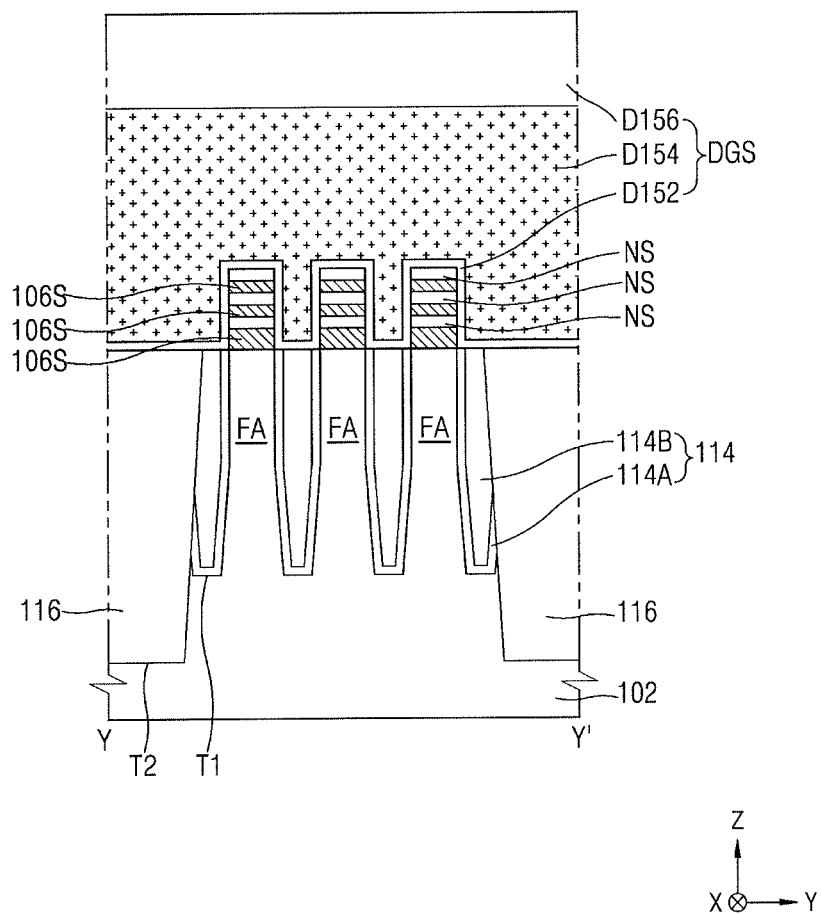

Referring to FIGS. 7A and 7B, the device structure shown in FIGS. 6A and 6B may be processed to form a plurality of dummy gate structures DGS extending across the fin-type active areas FA may be formed on the fin-type active areas FA in each of the first and second regions R1 and R2.

The dummy gate structures DGS may have a structure in which an oxide layer D152, a dummy gate layer D154, and a capping layer D156 are sequentially stacked. In an example of forming the dummy gate structures DGS, the oxide layer D152, the dummy gate layer D154, and the capping layer D156 may be sequentially formed to respectively cover an exposed surface of the stack structure of the sacrificial semiconductor layers 106S and the nanosheet semiconductor layers NS that cover the fin type active areas FA, an upper surface of the STI layer 114, and an upper surface of the device isolation layer 116 and then patterned, and thus the oxide layer D152, the dummy gate layer D154, and the capping layer D156 may be maintained only where necessary. The dummy gate structures DGS may be formed to have a planar shape corresponding to a planar shape of the gates 150 illustrated in FIG. 25A.

In some embodiments, the dummy gate layer D154 may include polysilicon, and the capping layer D156 may include a silicon nitride layer but the inventive concept is not limited thereto.

Figure 8:
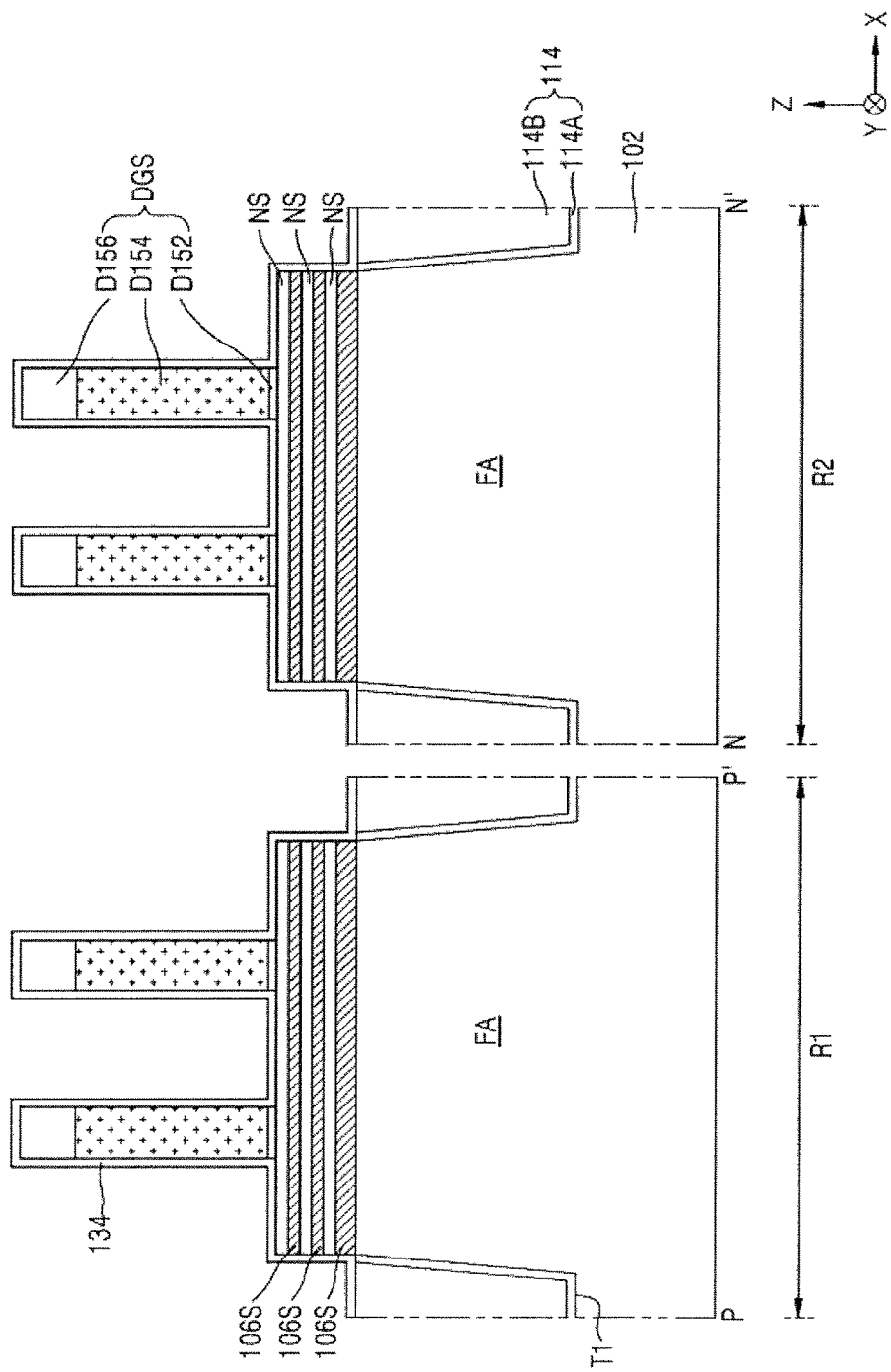

Referring to FIG. 8, an insulating liner 134 may be formed to cover an exposed surface of the dummy gate structures DGS, the exposed surface of the stack structure of the sacrificial semiconductor layers 106S and the nanosheet semiconductor layers NS, and the upper surface of each of the STI layer 114 and the device isolation layer 116. In some embodiments, the insulating liner 134 may include a silicon nitride layer.

In some embodiments, after the insulating liner 134 is formed, a halo implantation region may be formed in the nanosheet semiconductor layers NS by injecting impurities ions in the nanosheet semiconductor layers NS. In order to form the halo implantation region, P or As ions may be injected into the first region R1 as impurities, and B ions may be injected into the second region R2 as impurities.

Figure 9:
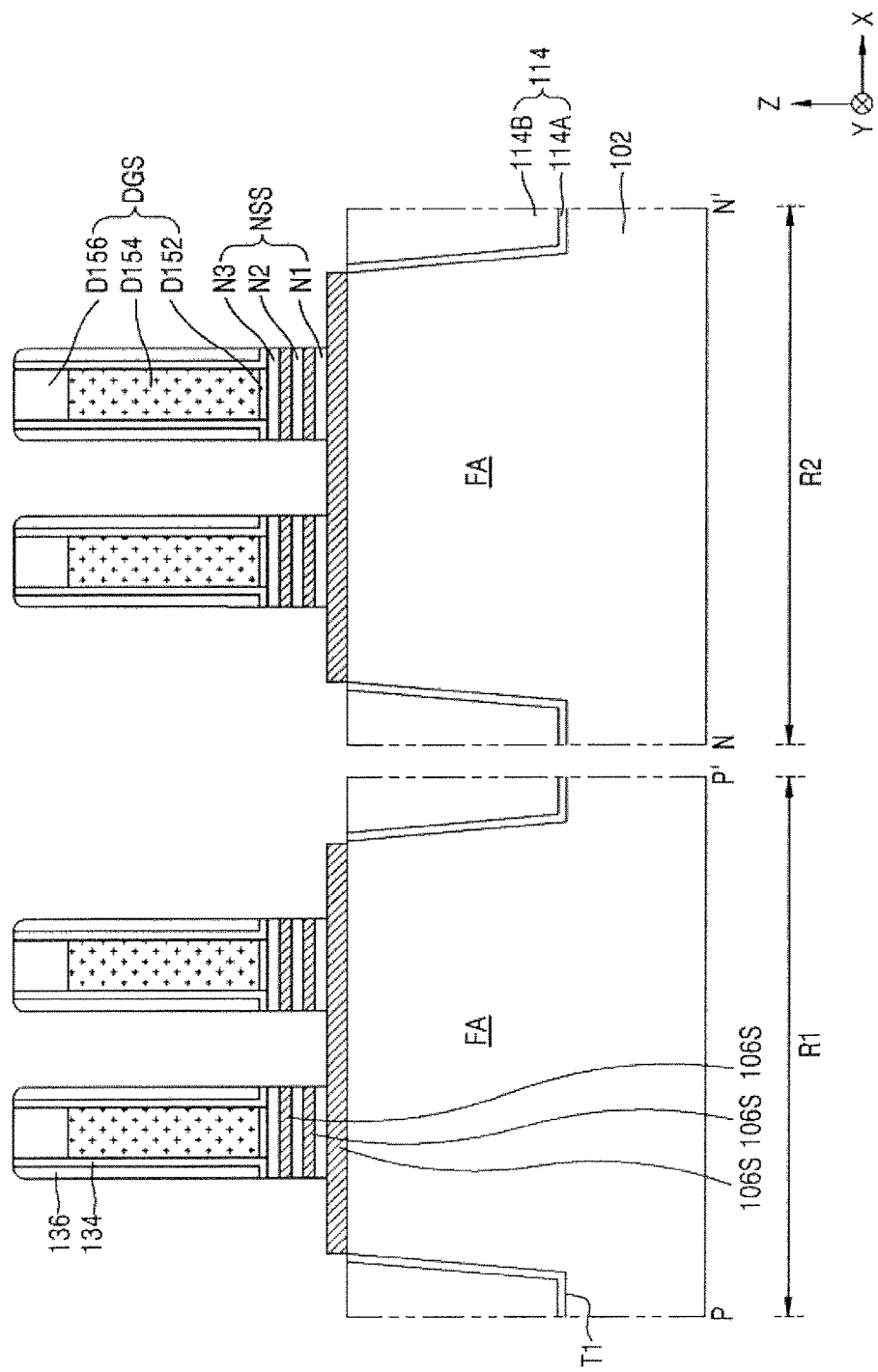

Referring to FIG. 9, first insulating spacers 136 covering opposite side walls of the dummy gate structures DGS may be formed, a part of the stack structure of the sacrificial semiconductor layers 106S and the nanosheet semiconductor layers NS may be removed by etching by using the dummy gate structures DGS and the first insulating spacers 136 as an etching mask, and a plurality of nanosheet stack structures NSS including a plurality of nanosheets N1, N2, and N3 may be formed from the nanosheet semiconductor layers NS.

To form the first insulating spacers 136, after a spacer layer including a silicon nitride layer is formed on a resultant of FIG. 8 in which the insulating liner 134 is formed, the first insulating spacers 136 may be left by etching back the spacer layer again.

When the stack structure of the sacrificial semiconductor layers 106S and the nanosheet semiconductor layers NS is etched, an etching process may be performed by using a point where the sacrificial semiconductor layer 106S that is the lowest layer among the plurality of sacrificial semiconductor layer 106S is exposed as an etching end point. Accordingly, after the nanosheet stack structures NSS are formed, the sacrificial semiconductor layers 106S covering the fin type active areas FA may be exposed between the nanosheet stack structures NSS. After the nanosheet stack structures NSS are formed, the sacrificial semiconductor layers 106S may be left between the fin type active area FA and the nanosheet stack structures NSS and between the nanosheets N1, N2, and N3.

FIG. 9 illustrates that both side surfaces of the nanosheet stack structures NSS and the sacrificial semiconductor layers 106S therebetween are perpendicular to a major surface of the substrate 102, but the inventive concept is not limited thereto. It will be described in detail with reference to FIGS. 24A through 24Q.

Figure 10:
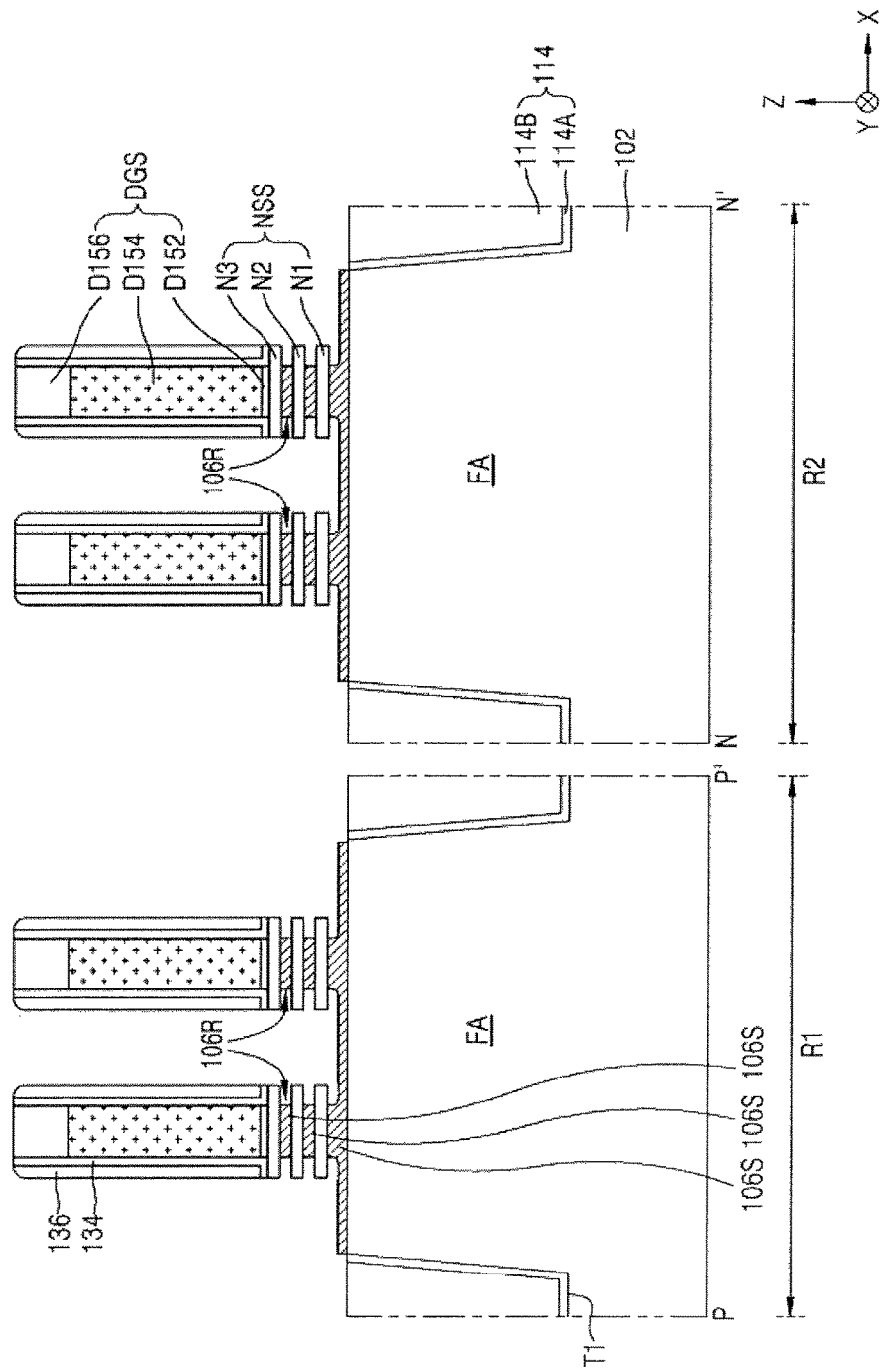

Referring to FIG. 10, an isotropic etching process may be used to form recess regions 106R between the nanosheets N1, N2, and N3 by removing some of the sacrificial semiconductor layers 106S exposed at two sides of each of the nanosheet stack structures NSS.

FIG. 10 illustrates that both side surfaces of the sacrificial semiconductor layers 106S exposed at the recess regions 106R are perpendicular to a major surface of the substrate

102, but the inventive concept is not limited thereto. It will be described in detail with reference to FIGS. 24A through 24Q.

During the formation of the recess regions 106R, a part of an upper surface of an exposed portion of the lowest sacrificial semiconductor layer 106S covering the fin type active areas FA may be removed between the nanosheets N1, N2, and N3.

In some embodiments, the isotropic etching process for forming the recess regions 106R may be performed through a wet etching process that uses a difference in an etch selectivity between the sacrificial semiconductor layers 106S and the nanosheet stack structures NSS.

In order to form the recess regions 106R, widths of portions of the sacrificial semiconductor layers 106S in a horizontal direction, which remain after the sacrificial semiconductor layers 106S are partly removed, may be similar to a width of the dummy gate layer D154 in a horizontal direction. For example, a width of the recess regions 106R in a horizontal direction may be similar to a sum of widths of each of the insulating liner 134 and the first insulating spacers 136 in a horizontal direction. In some embodiments, the width of the sacrificial semiconductor layers 106S in a horizontal direction, which is remaining after a part of the sacrificial semiconductor layers 106S is removed, may be greater than that of the dummy gate layer D154 in a horizontal direction. In some embodiments, the width of the sacrificial semiconductor layers 106S in a horizontal direction, which is remaining after a part of the sacrificial semiconductor layers 106S is removed, may be less than that of the dummy gate layer D154 in a horizontal direction.

Figure 11:
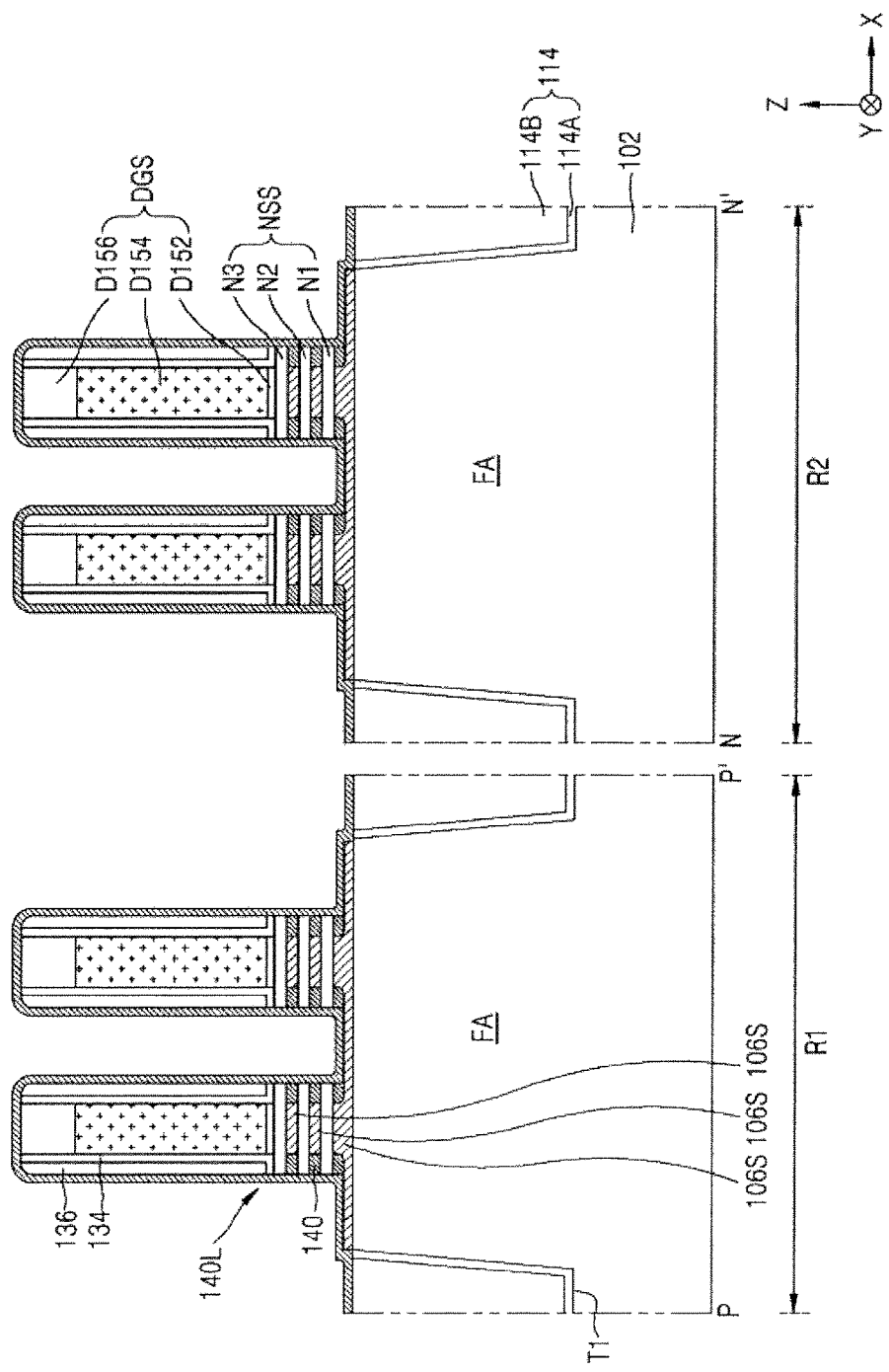

Referring to FIG. 11, an insulating structure 140L including second insulating spacers 140 filling the recess regions 106R (see FIG. 10) formed between the nanosheets N1, N2, and N3 may be formed. In some embodiments, the insulating structure 140L may include a silicon nitride layer. In some embodiments, the insulating structure 140L may include a plurality of insulating layers.

Figure 12:
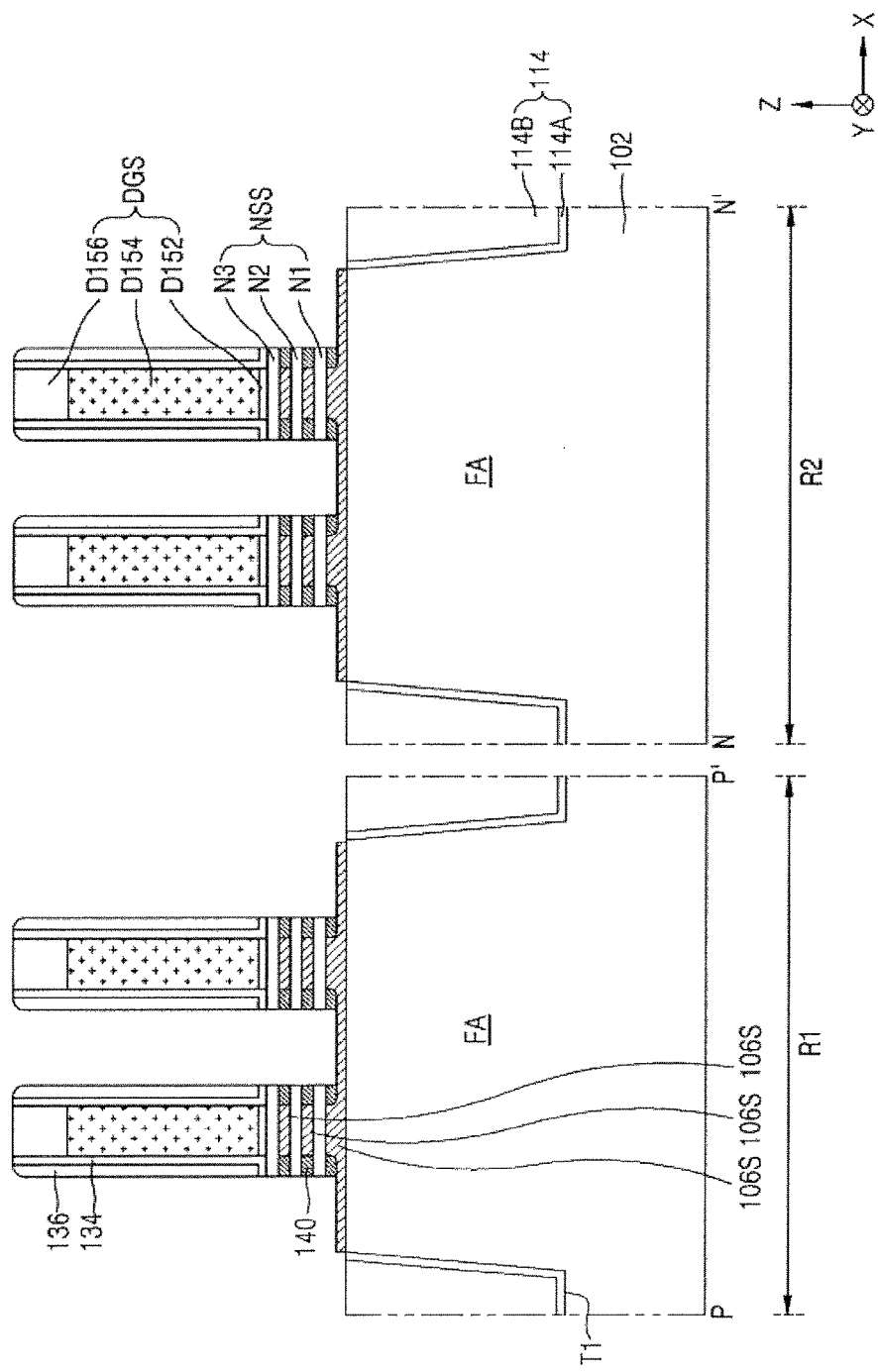

Referring to FIG. 12, when removing a portion of the insulating structure 140L (see FIG. 11) outside the recess region 106R (see FIG. 10), the second insulating spacer 140 filling the recess region 106R may remain.

A width of the second insulating spacer 140 in a horizontal direction may be similar to the sum of widths of each of the insulating liner 134 and the first insulating spacers 136 in a horizontal direction. In some embodiments, the width of the second insulating spacer 140 in a horizontal direction may be less than or greater than the sum of widths of each of the insulating liner 134 and the first insulating spacers 136 in a horizontal direction.

FIG. 12 illustrates that at least one side surface of the second insulating spacer 140 is perpendicular to a major surface of the substrate 102, but the inventive concept is not limited thereto. It will be described in detail with reference to FIGS. 24A through 24Q.

After removing the portion of the insulating structure 140L illustrated in FIG. 11 outside the recess region 106R (see FIG. 10), both side walls of the nanosheets N1, N2, and N3, the second insulating spacers 140, and the sacrificial semiconductor layer 106S that is the lowest layer among the plurality of sacrificial semiconductor layers 106S may be exposed.

Figure 13:
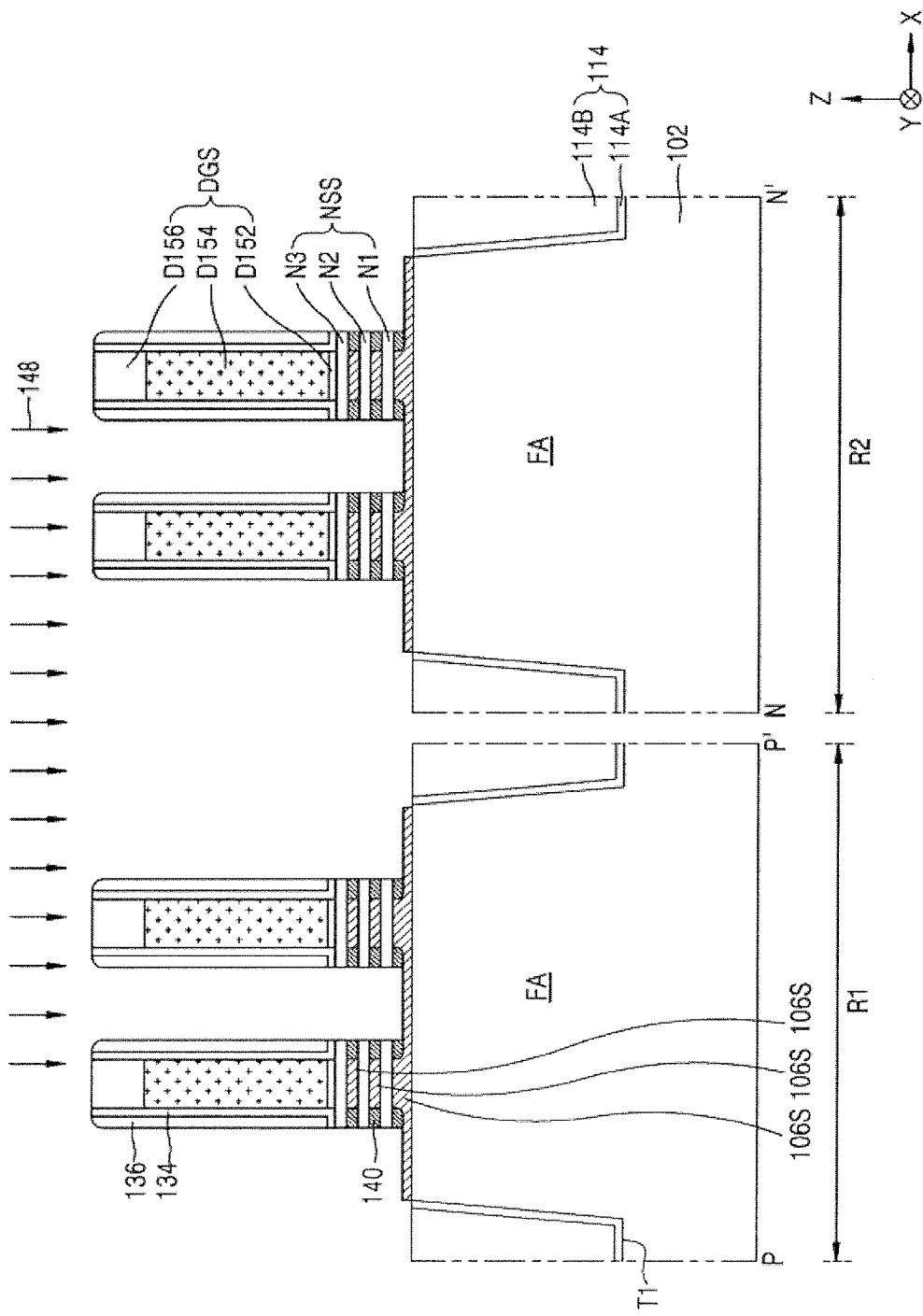

Referring to FIG. 13, the exposed both side walls of the nanosheets N1, N2, and N3 and the exposed surface of the sacrificial semiconductor layer 106S that is the lowest layer among the plurality of sacrificial semiconductor layers 106S may be exposed in a cleaning atmosphere 148, and thus a natural oxide layer may be removed from the exposed side walls and the exposed surfaces.

In some embodiments, the cleaning atmosphere 148 may use a first cleaning process using a wet cleaning process, a second cleaning process using a SiCoNi (® Applied Materials, Inc.) etching process, or a combination thereof. During the wet cleaning process, DHF (diluted HF), $NH_4OH$, TMAH (tetramethyl ammonium hydroxide), KOH (potassium hydroxide) solution, etc. may be used. The SiCoNi™ etching process may be performed using a hydrogen source of ammonia $NH_3$ and a fluorine source of nitrogen trifluoride $NF_3$.

During a cleaning process for removing the natural oxide layer, insulating layers constituting the second insulating spacers 140, in particular, insulating layers exposed to the cleaning atmosphere 148, may be configured as materials having an etching resistance with respect to the cleaning atmosphere 148, and thus the second insulating spacers 140 may not be consumed during the removing of the natural oxide layer under the cleaning atmosphere 148.

Figure 14:
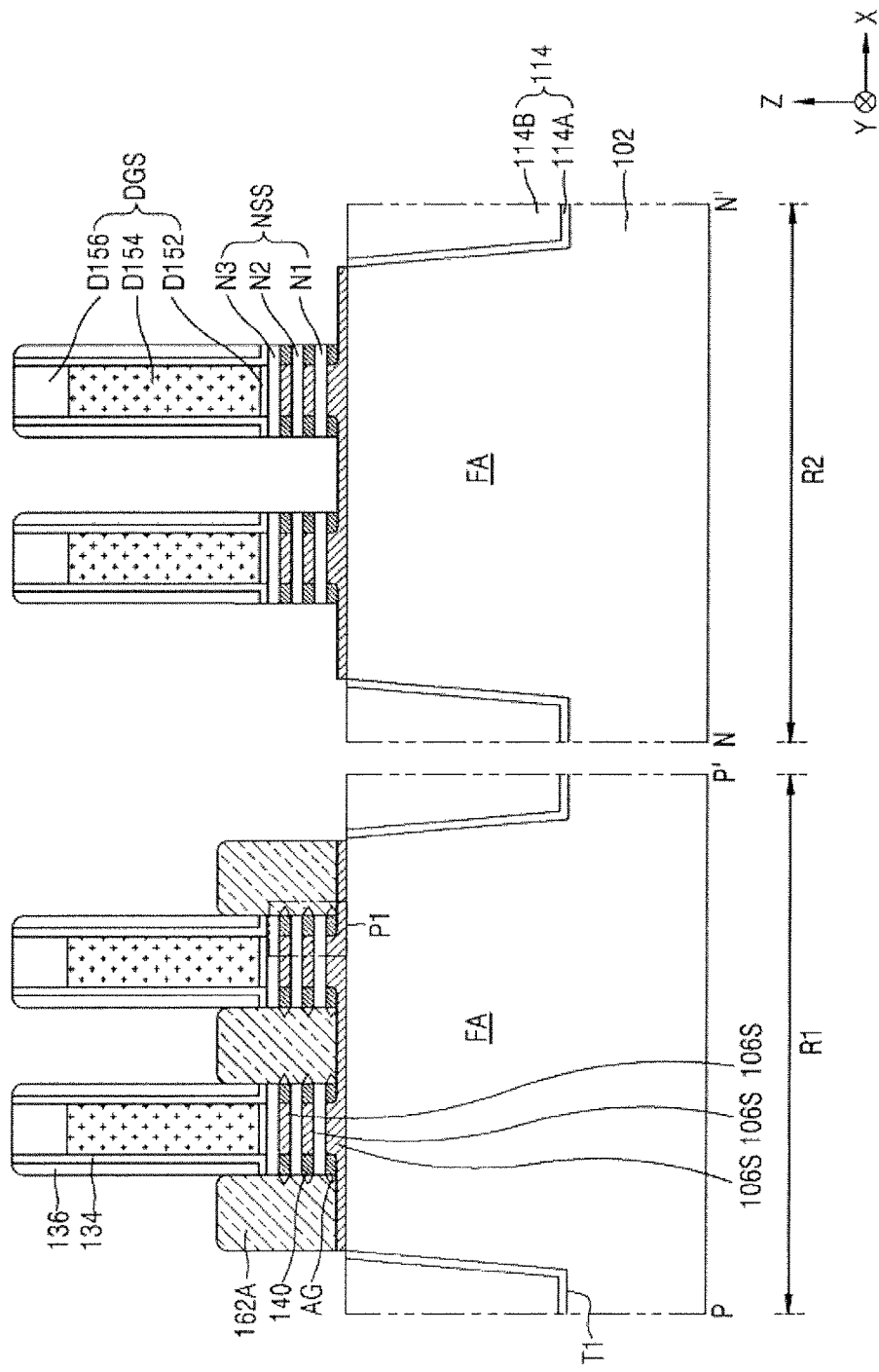

Referring to FIG. 14, in the first region R1 (which may be the p-channel metal-oxide-semiconductor (PMOS) transistor region as discussed above in connection with FIG. 1), a first semiconductor layer 162A for forming first source and drain regions 162 (see FIG. 25B) may be formed by epitaxially growing a semiconductor material from both side walls exposed to the plurality of nanosheets N1, N2, and N3 from which the natural oxide layer is removed and from the exposed surface of the sacrificial semiconductor layer 106S that is the lowest layer among the plurality of sacrificial semiconductor layers 106S. In the second region R2 (which may be the n-channel metal-oxide-semiconductor (NMOS) region as discussed above in connection with FIG. 1), a mask layer (not shown) covering the second region R2 may be formed so as to prevent formation of the first semiconductor layer 162A.

Since the first and second insulating spacers 136 and 140 may include an insulating layer in which seeding and epitaxial growth of a semiconductor atom do not occur on their surface, and thus an epitaxial growth process for forming the first semiconductor layer 162A may be performed only on the exposed both side walls of the plurality of nanosheets N1, N2, and N3 and the exposed surface of the sacrificial semiconductor layer 106S that is the lowest layer among the plurality of sacrificial semiconductor layers 106S.

The first semiconductor layer 162A may include a semiconductor material including Ga. For example, the first semiconductor layer 162A may include a semiconductor such as Ge, or a compound semiconductor such as SiGe. In some embodiments, the first semiconductor layer 162A may include B ions as impurities.

In some embodiments, the first semiconductor layer 162A may grow a specific crystal surface to form a certain angle from a growth surface. For example, a (111) plane of the first semiconductor layer 162A may grow. Therefore, when the (111) plane of the first semiconductor layer 162A is saturated during growth, an air spacer AG may be formed between the second insulating spacer 140 and the first semiconductor layer 162A. A process of forming the air spacer AG will be described in detail with reference to FIGS. 15A through 15E.

FIGS. 15A through 15E are enlarged sectional views of portions corresponding to a region P1 of FIG. 14 (where region P1 in FIG. 14 is a portion of what may be a p-channel metal-oxide-semiconductor (PMOS) transistor in the region R1 of FIG. 1). FIGS. 15A through 15E illustratively show successive stages in a process of forming the air spacer AG in a semiconductor device.

Referring to FIGS. 15A through 15E, the first semiconductor layer 162A may be formed from both side walls exposed to the nanosheets N1, N2, and N3 of the nanosheet stack structure NSS, which were formed from the nanosheet semiconductor layers NS of FIG. 1, and from the exposed surface of the sacrificial semiconductor layer 106S, which is the lowest layer among the plurality of sacrificial semiconductor layers 106S of FIG. 1, by performing an epitaxial growth process. During the epitaxial growth process, the first semiconductor layer 162A may grow a specific crystal surface, to form a certain angle from a growth surface, by adjusting temperature and pressure. For example, the (111) plane of the first semiconductor layer 162A may grow. Therefore, a growth rate of the growth surface of first semiconductor layer 162A may vary according to a crystal surface of the growth surface.

Therefore, the first semiconductor layer 162A, initially growing from the both side walls exposed to the nanosheets N1, N2, and N3 of the nanosheet stack structure NSS and from the exposed surface of the sacrificial semiconductor layer 106S that is the lowest layer among the plurality of sacrificial semiconductor layers 106S (see FIG. 15A), may not cover all or at least a part of a surface of the second insulating spacer 140. In more detail, when parts of the first semiconductor layer 162A, which progressively grow from each of the exposed surfaces of the nanosheets N1, N2, and N3 and the exposed surface of the sacrificial semiconductor layer 106S (progressive stages in the growth being shown in FIGS. 15B and 15C), contact one another (see FIG. 15D), the air spacer AG may be formed surrounded by the second insulating spacer 140 (on one side) and the first semiconductor layer 162A (on an opposing side) while the parts of the first semiconductor layer 162A are saturated after stopping growth (see FIG. 15E).

Figure 16:
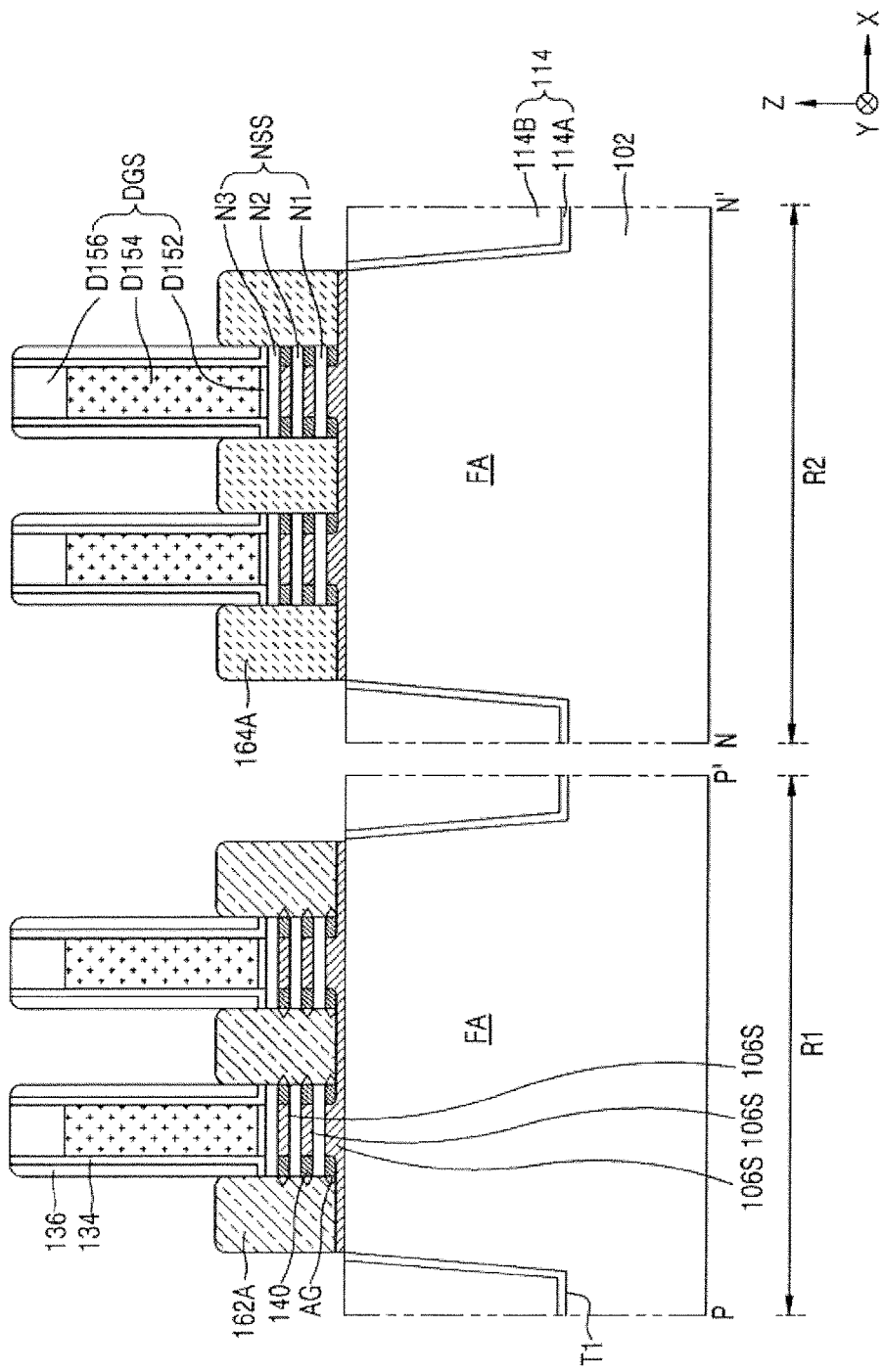

Referring to FIG. 16, in the second region R2, a second semiconductor layer 164A for forming second source and drain regions 164 (see FIG. 25B) may be formed by epitaxially growing a semiconductor material from both side walls exposed to the plurality of nanosheets N1, N2, and N3 and from the exposed surface of the sacrificial semiconductor layer 106S that is the lowest layer among the plurality of sacrificial semiconductor layers 106S. In the first region R1, a mask layer (not shown) covering the first region R1 may be formed so as to prevent formation of the second semiconductor layer 164A.

Since the first and second insulating spacers 136 and 140 may include an insulating layer, seeding and epitaxial growth of a semiconductor atom do not occur on their surface, and thus an epitaxial growth process for forming the second semiconductor layer 164A may be performed only on the exposed both side walls of the plurality of nanosheets N1, N2, and N3 and the exposed surface of the sacrificial semiconductor layer 106S that is the lowest layer among the plurality of sacrificial semiconductor layers 106S.

A material of the second semiconductor layer 164A in the second region may be different from that of the first semiconductor layer 162A in the first region. The second semiconductor layer 164A may include a semiconductor material including Si. For example, the second semiconductor layer 164A may include a semiconductor such as Si, or a compound semiconductor such as SiC. In some embodiments, the second semiconductor layer 164A may include P or As ions as impurities. The second semiconductor layer 164A may not include Ge, unlike the first semiconductor layer 162A.

In some embodiments, the second semiconductor layer 164A may grow from a growth surface in every direction. Therefore, the second semiconductor layer 164A may directly contact and completely cover a surface of a sidewall of the second insulating spacer 140 opposite the sacrificial semiconductor layers 106S. Therefore, in the second region R2, an air spacer may not be formed between the second insulating spacer 140 and the second semiconductor layer 164A.

Figure 17:
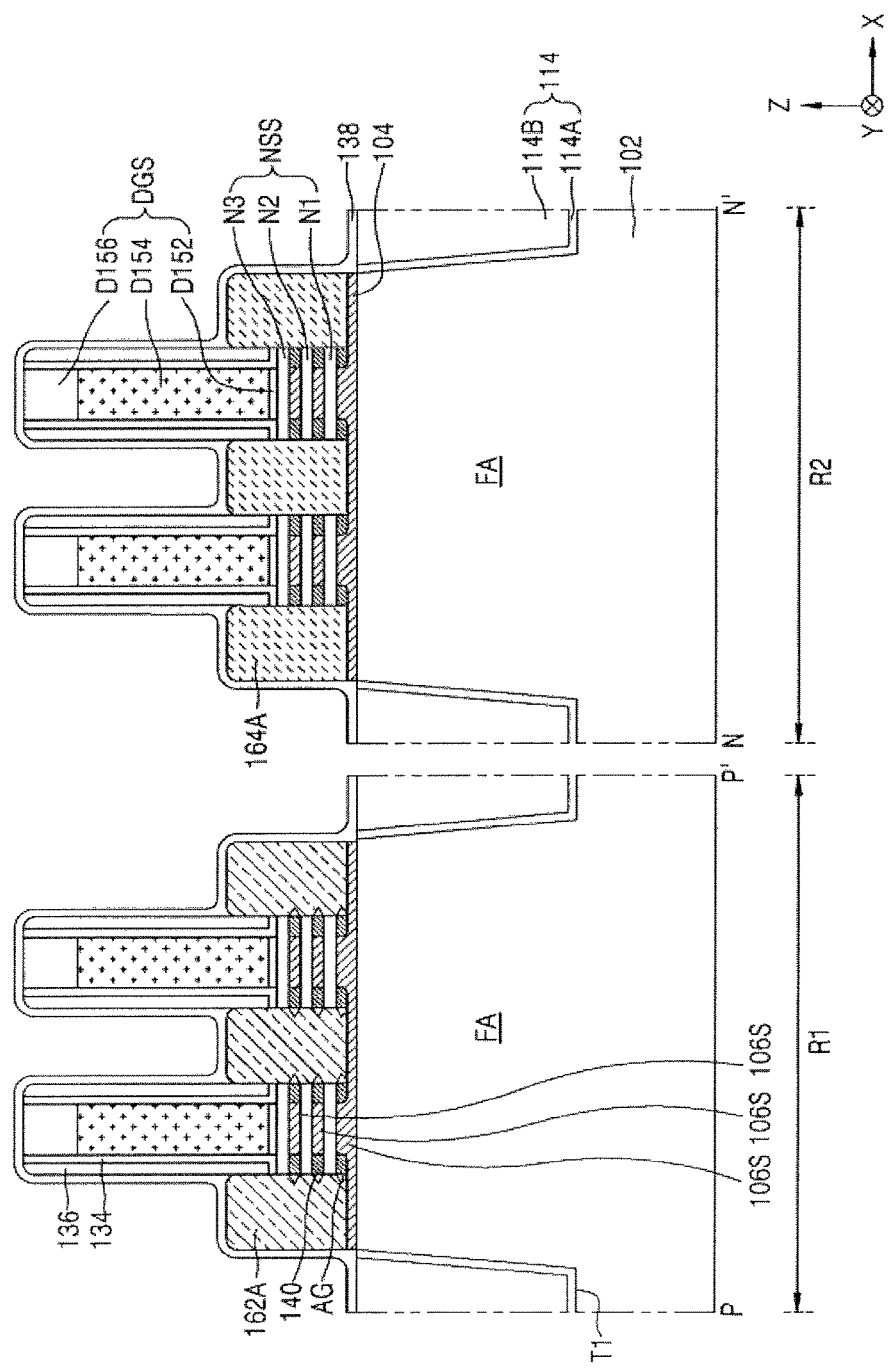

Referring to FIG. 17, a protection layer 138 covering a resultant including the first and second semiconductor layers 162A and 164A may be formed. In some embodiments, the protection layer 138 may include a silicon nitride layer. An atomic layer deposition (ALD) or a chemical vapor deposition (CVD) process may be used to form the protection layer 138. In some embodiments, the protection layer 138 may be omitted.

In some embodiments, the protection layer 138 may be separately formed in each of the first and second regions R1 and R2. For example, after the first region R1 is formed, the protection layer 138 of the first semiconductor layer 162A may be formed before forming the second semiconductor layer 164A, and the protection layer 138 of the second region R2 may be formed after the second semiconductor layer 164A is formed.

Figure 18:
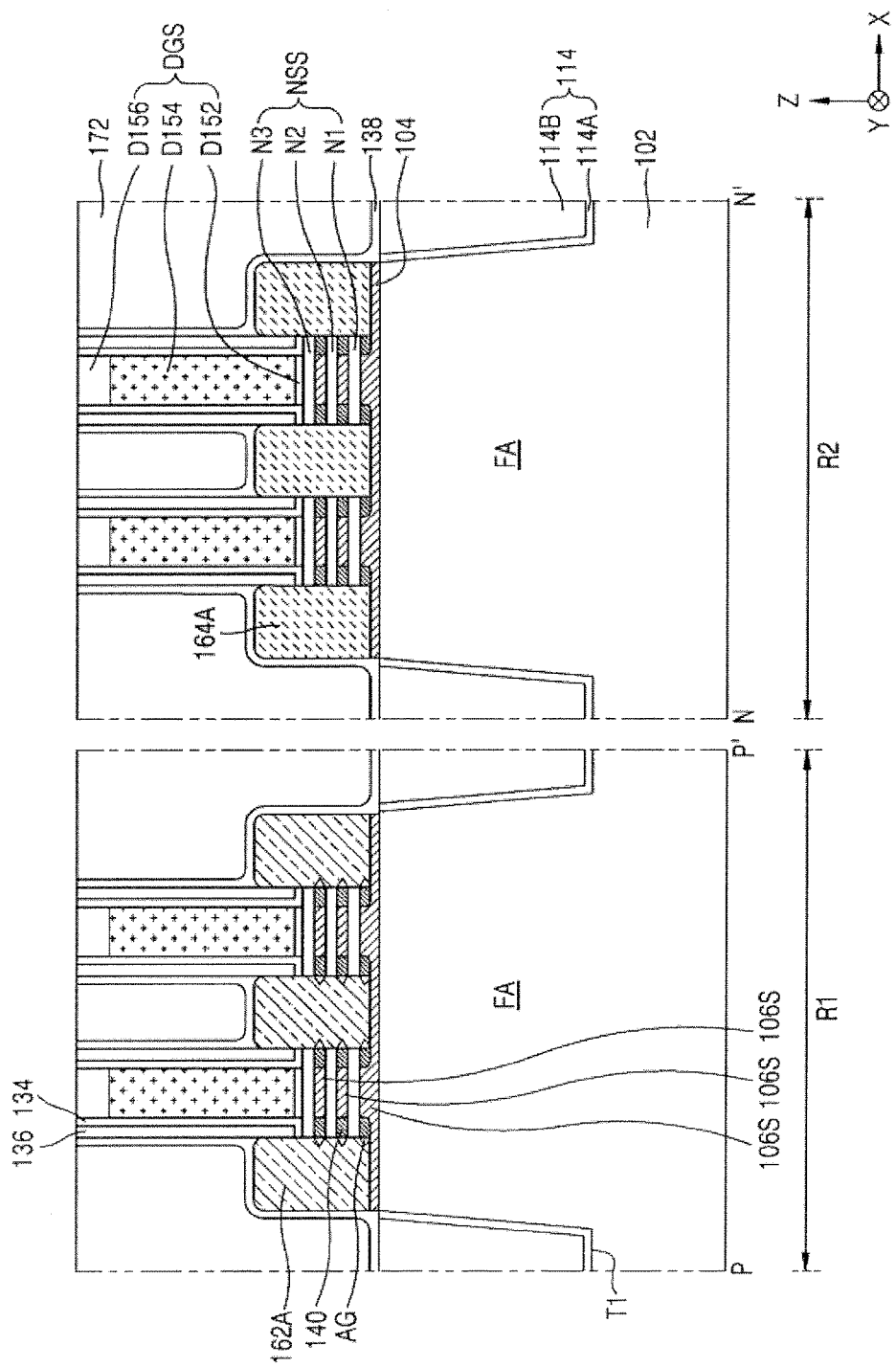

Referring to FIG. 18, after an inter-gate insulating layer 172 is formed on the protection layer 138, an upper surface of the capping layer D156 may be exposed by planarizing the inter-gate insulating layer 172. In some embodiments, the inter-gate insulating layer 172 may include a silicon oxide layer.

Figure 19:
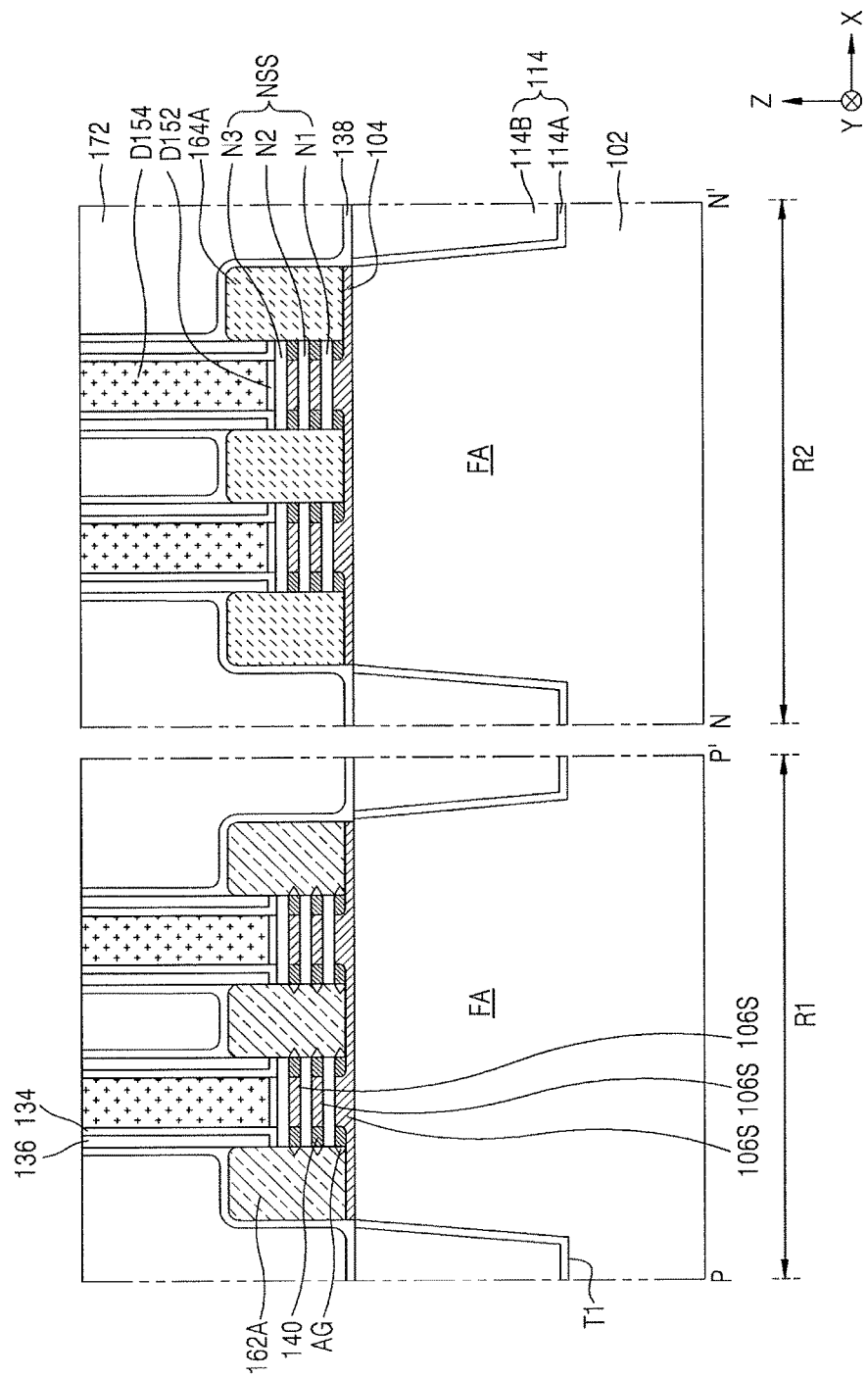

Referring to FIG. 19, the capping layer D156 (see FIG. 18) covering an upper surface of the dummy gate layer D154 may be etched back, and the insulating liner 134, the first insulating spacer 136, and the protection layer 138 that surround the capping layer D156 may be etched back, and an upper portion of the inter-gate insulating layer 172 may be polished to a depth equal to a partial thickness thereof, such that the upper surface of the inter-gate insulating layer 172 may be located at approximately the same level as that of the upper surface of the dummy gate layer D154.

Figure 20:
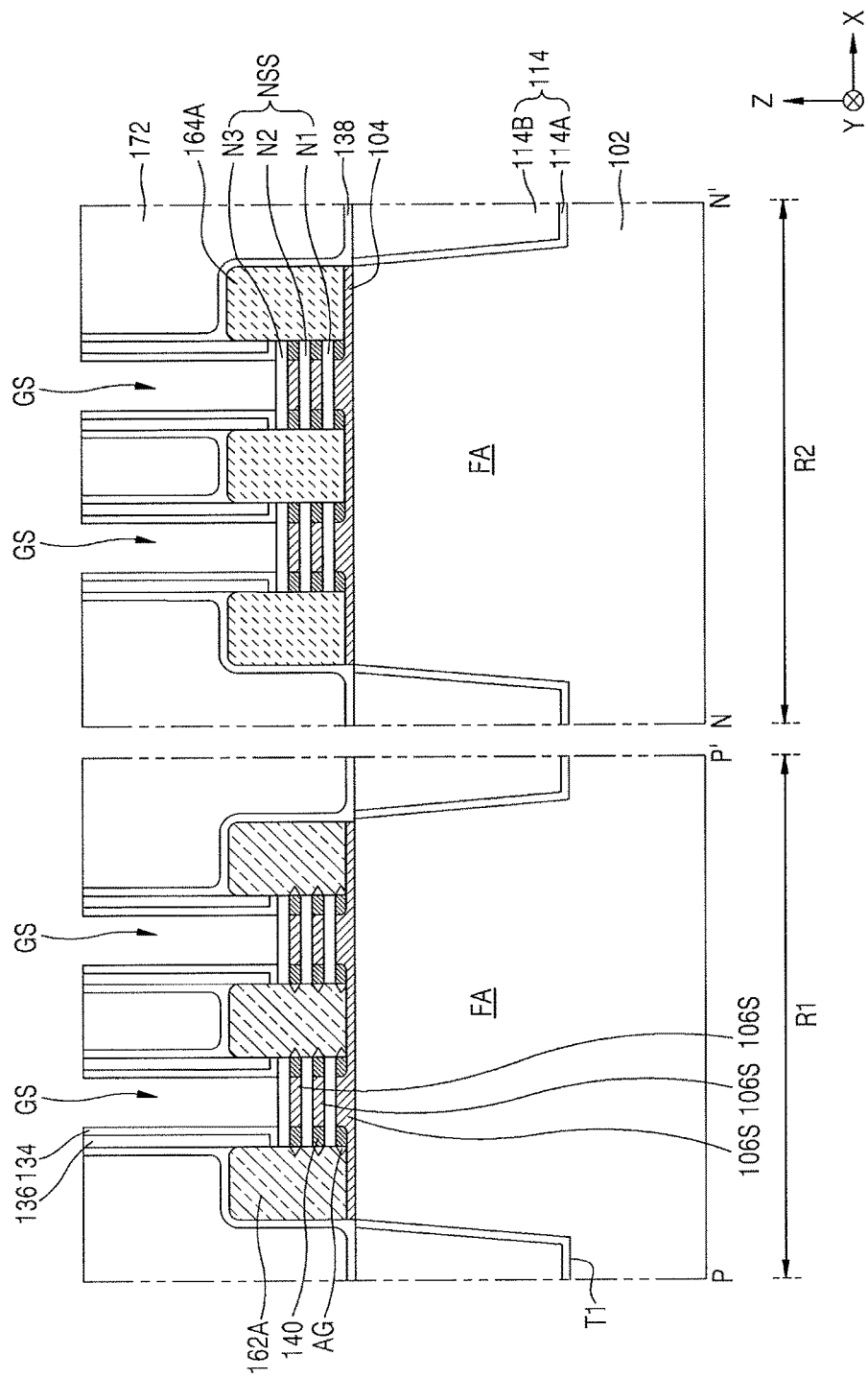

Referring to FIG. 20, the dummy gate layer D154 exposed through the inter-gate insulating layer 172 and the oxide layer D152 present below the dummy gate layer D154 may be removed such that the nanosheet N3 may be exposed through gate spaces GS.

Figure 21:
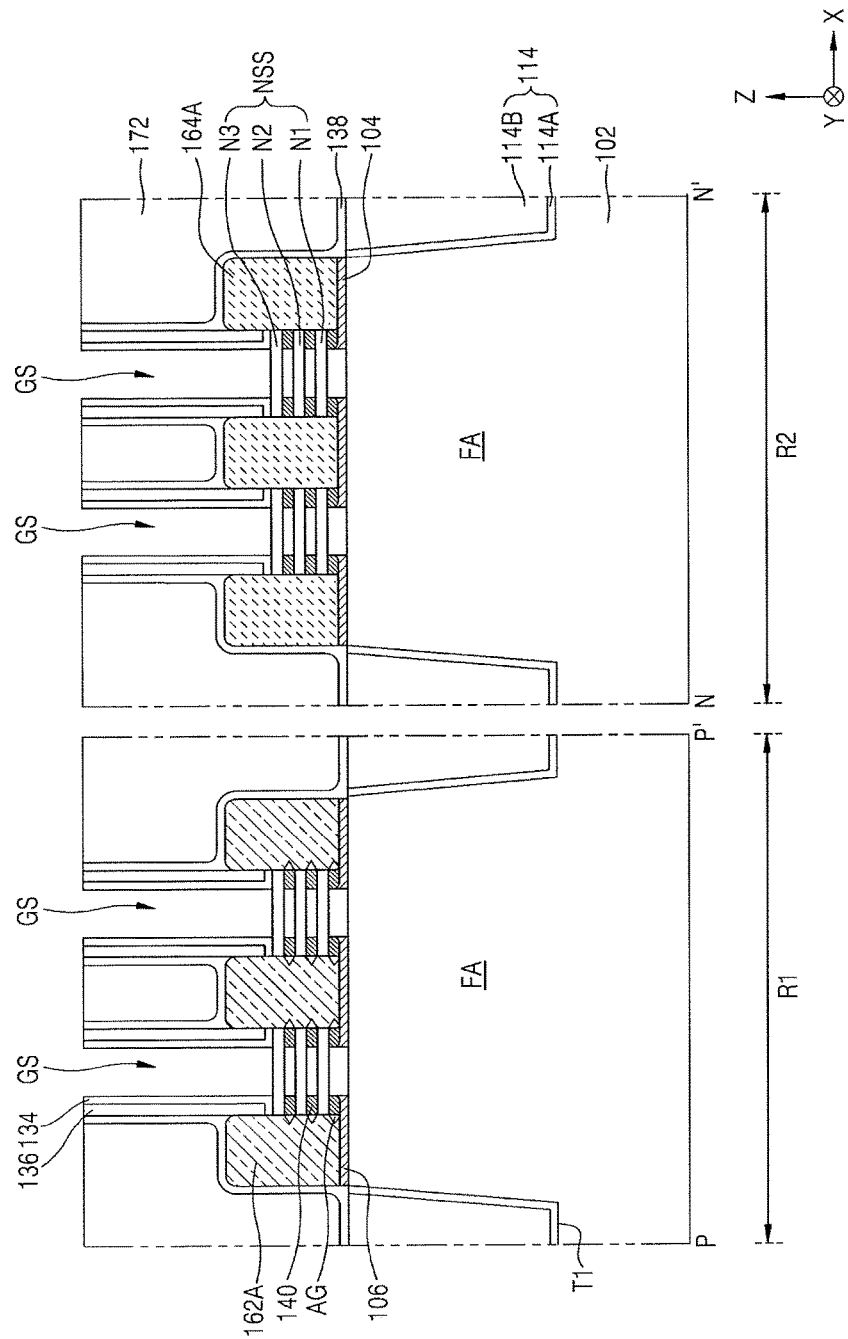

Referring to FIG. 21, parts of the plurality of sacrificial semiconductor layers 106S remaining on the fin type active area FA may be removed such that the nanosheets N1, N2, and N3 and the upper surface 104 of the fin type active area FA may be partially exposed through the gate spaces GS. Therefore, the gate spaces GS may extend to the removed parts of the plurality of sacrificial semiconductor layers 106S.

The sacrificial semiconductor layer 106S that is the lowest layer among the plurality of sacrificial semiconductor layers 106S may not be completely removed so that a part of the sacrificial semiconductor layer 106S may be left on the fin type active area FA in lower portions of the second insulating spacer 140, and the first and second semiconductor layers 162A and 164A. A portion of the sacrificial semiconductor layer 106S remaining on the fin type active area FA may constitute a buffer semiconductor layer 106.

Figure 22:
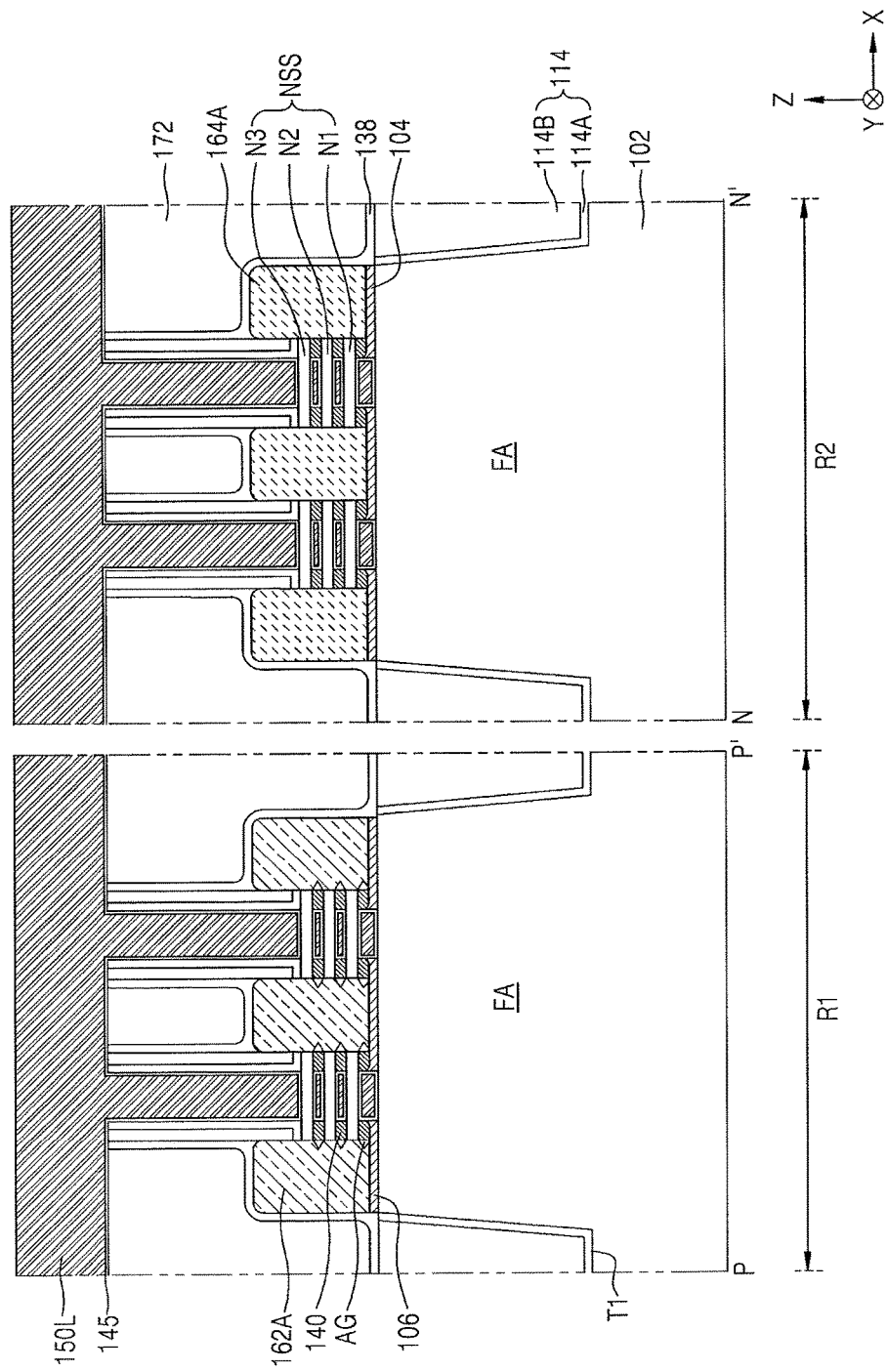

Referring to FIG. 22, after the natural oxide layer is removed from the exposed surfaces of the nanosheets N1, N2, and N3 and the fin type active area FA, a gate dielectric layer 145 may be formed on surfaces exposed by the gate spaces GS (see FIG. 21), and a gate forming conductive layer 150L covering the inter-gate insulating layer 172 may be formed while filling the gate spaces GS on the gate dielectric layer 145.

The gate dielectric layer 145 may have a stack structure of an interfacial layer and a high dielectric layer. The interfacial layer may cure an interface defect between the upper surface 104 of the plurality of fin type active areas FA and surfaces of the plurality of nanosheets N1, N2, and N3 and the high dielectric layer. In some embodiments, the interfacial layer may include a low dielectric material layer having a dielectric constant of 9 or less, e.g., a silicon oxide layer, a silicon oxynitride layer, or a combination thereof. In some other embodiments, the interfacial layer may include silicate, a combination of the silicate and a silicon oxide layer, or a combination of the silicate and a silicon oxynitride layer. In some embodiments, the interfacial layer may be omitted. The high dielectric layer may include a material having a dielectric constant greater than that of the silicon oxide layer. For example, the high dielectric layer may have a dielectric constant of about 10 to about 25. The high dielectric layer may include a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but is not limited thereto. The high dielectric layer may be formed by an ALD, a CVD, or a physical vapor deposition (PVD) process. The high dielectric layer may have a thickness ranging from about 10 Å to about 40 Å, but is not limited thereto.

The gate forming conductive layer 150L may include a layer containing metal for adjusting a work function, and a layer containing metal for filling a gap formed on an upper portion of the layer containing metal for adjusting the work function. In some embodiments, the gate forming conductive layer 150L may have a structure in which a metal nitride layer, a metal layer, a conductive capping layer, and a gap-fill metal layer are sequentially stacked. The metal nitride layer and the metal layer may each include at least one metal material selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride layer and the metal layer may be formed by the ALD process, a metal organic ALD (MOALD) process, or a metal organic CVD (MOCVD) process. The conductive capping layer may act as a protective layer for preventing oxidation of a surface of the metal layer. In addition, the conductive capping layer may act as a wetting layer for making a deposition of another conductive layer on the metal layer easy. The conductive capping layer may include a metal nitride layer, e.g., titanium nitride (TiN), tantalum nitride (TaN), or a combination thereof, but is not limited thereto. The gap-fill metal layer may extend on the conductive capping layer. The gap-fill metal layer may include a tungsten (W) layer. The gap-fill metal layer may be formed by the ALD, the CVD, or the PVD process. The gap-fill metal layer may embed a recess space formed by a step between areas on an upper surface of the conductive capping layer without a void. In some embodiments, the gate forming conductive layer 150L may include a stack structure of TiAlC/TiN/W, a stack structure of TiN/TaN/TiAlC/TiN/W, or a stack structure of TiN/TaN/TiN/TiAlC/TiN/W. In the above stack structures, a TiAlC layer or a TiN layer may function as a layer containing metal for adjusting the work function.

In some embodiments, the gate forming conductive layers 150L formed in each of the first and second regions R1 and R2 may have different stack structures. For example, the gate forming conductive layers 150L formed in each of the first and second regions R1 and R2 may include metal materials for adjusting the work function that are different from each other.

Figure 23:
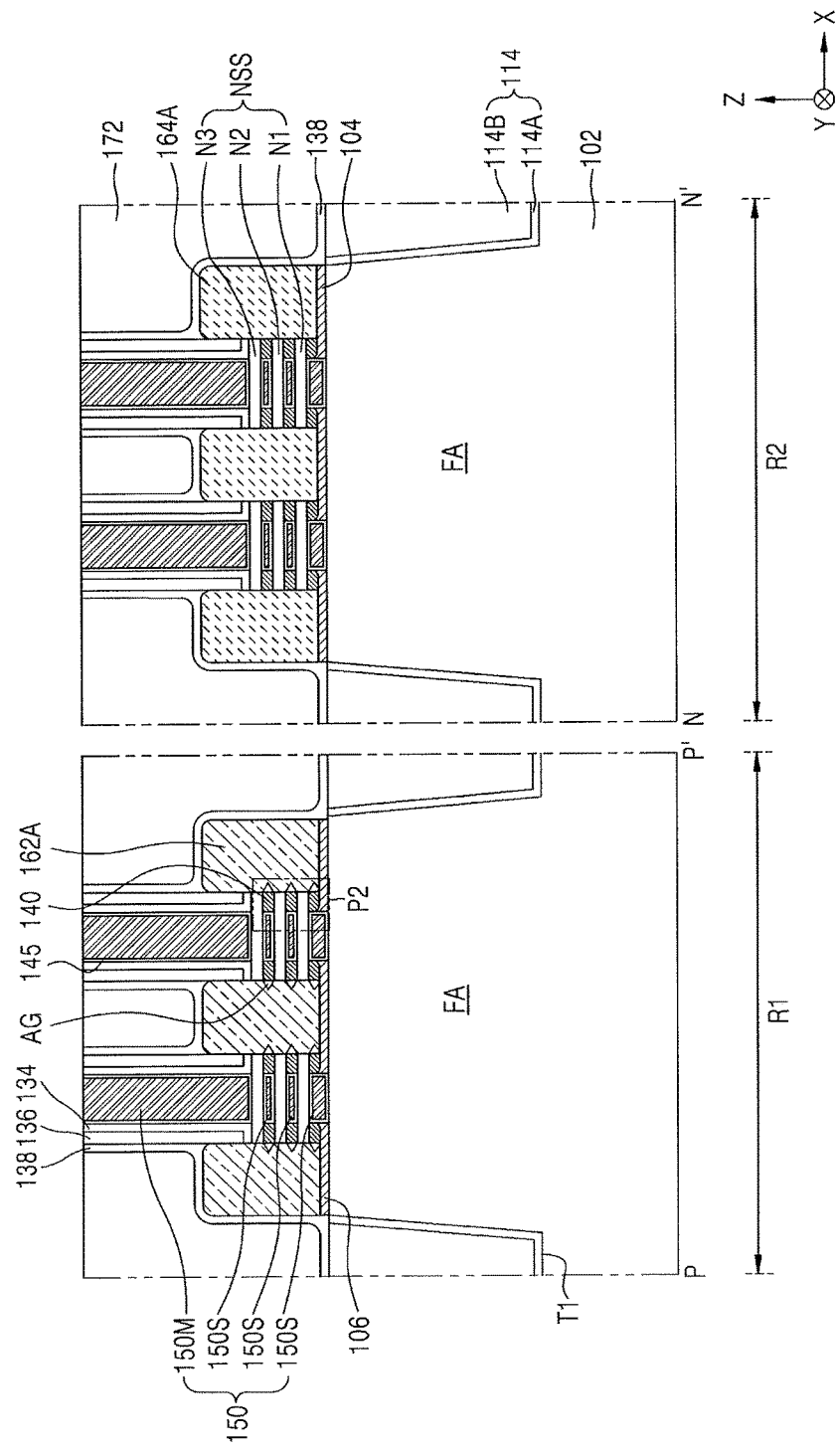

Referring to FIG. 23, a part of an upper surface of the gate forming conductive layer 150L (see FIG. 22) may be removed until an upper surface of the inter-gate insulating layer 172 is exposed, and the gate 150 filling the gate spaces GS may be formed.

The gate 150 may include a main gate portion 150M covering an upper surface of the nanosheet stack structure NSS including the nanosheets N1, N2, and N3 and a plurality of sub-gate portions 150S connected to the main gate portion 150M and formed in spaces between the nanosheets N1, N2, and N3 and the fin type active areas FA. A length of each of the sub-gate portions 150S in a horizontal direction may be the same as that of the main gate portion 150M in a horizontal direction. In some embodiments, the length of each of the sub-gate portions 150S in a horizontal direction may be greater or less than that of the main gate portion 150M in a horizontal direction.

The plurality of second insulating spacers 140 may be disposed on both sidewalls of each of the sub-gate portions 150S and between which the gate dielectric layer 145 is interposed. Therefore, the second insulating spacers 140 may cover the both sidewalls of each of the sub-gate portions 150S and between which the gate dielectric layer 145 is interposed.

In the first region R1, a plurality of air spacers AG may be formed between each of the second insulating spacers 140 and the first semiconductor layer 162A. In the second region R2, a plurality of air spacers AG may not be formed between each of the second insulating spacers 140 and the second semiconductor layer 164A. For example, the second semiconductor layer 164A may directly contact and completely cover a surface of a sidewall of the plurality of second insulating spacers 140 opposite the sub-gate portions 150S.

Figure 24A:
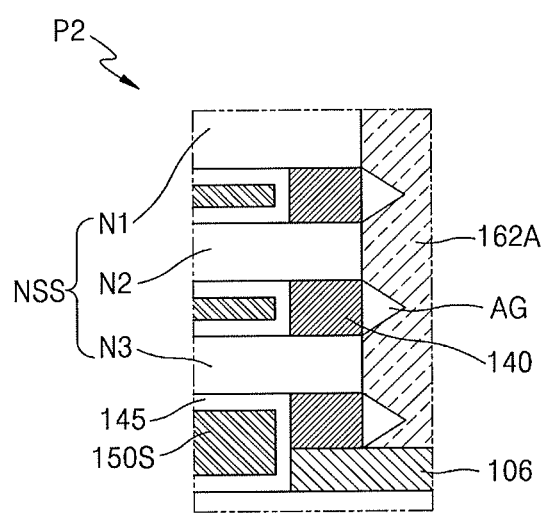
FIGS. 24A through 24Q illustrate cross-sectional views of configurations of various air spacers that are employable in a semiconductor device according to example embodiments.
Figure 24B:
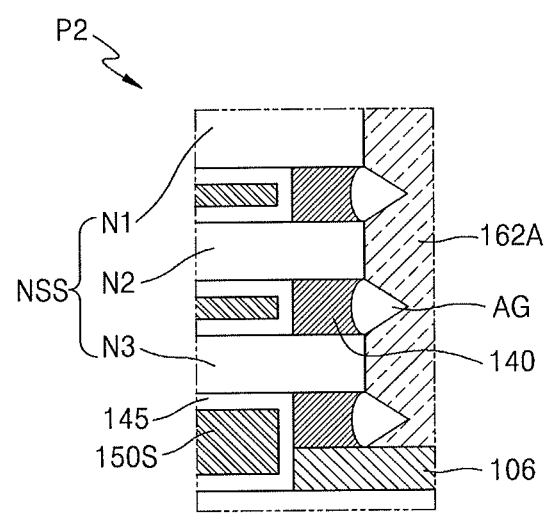
Figure 24C:
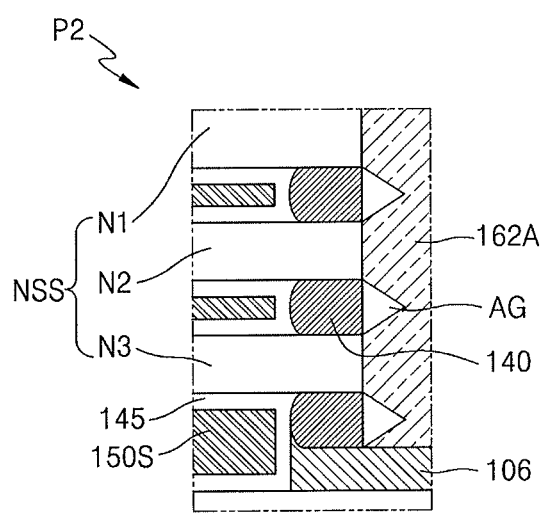
Figure 24D:
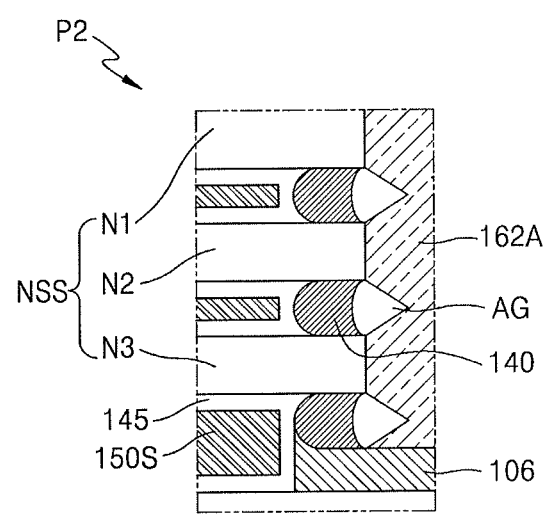
Figure 24E:
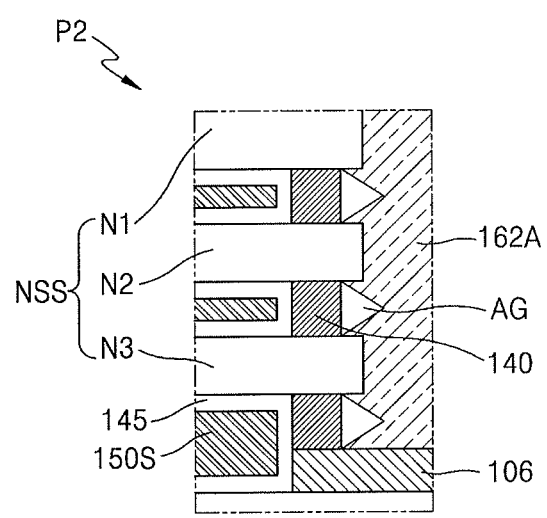
Figure 24F:
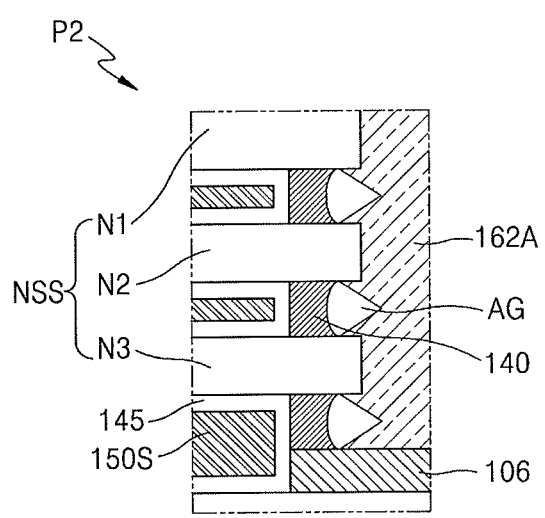
Figure 24G:
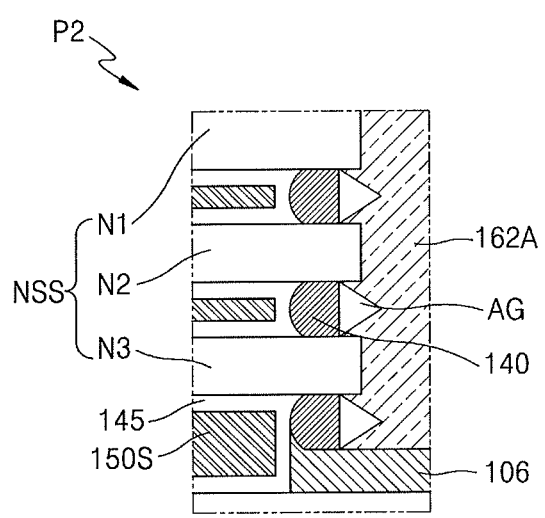
Figure 24H:
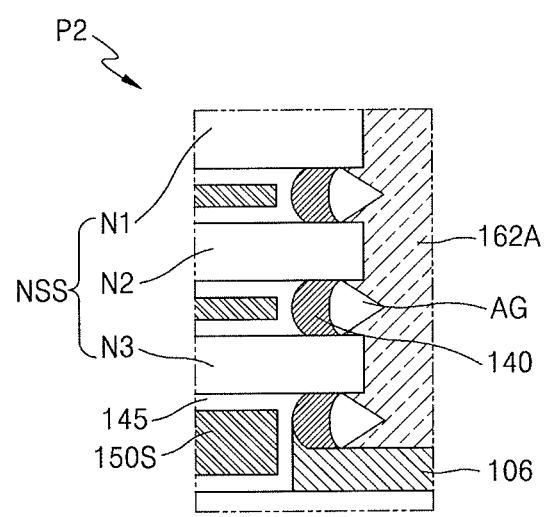
Figure 24I:
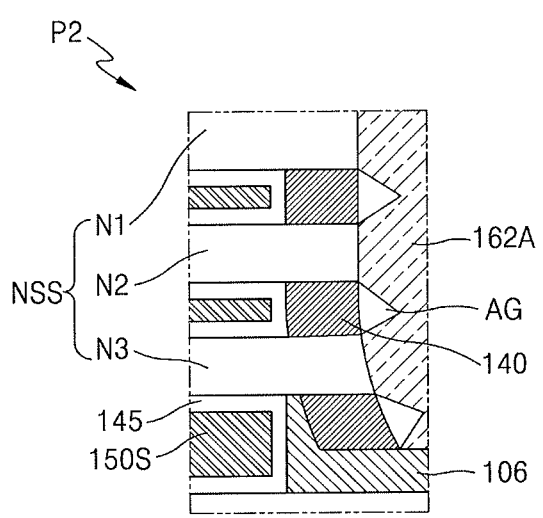
Figure 24J:
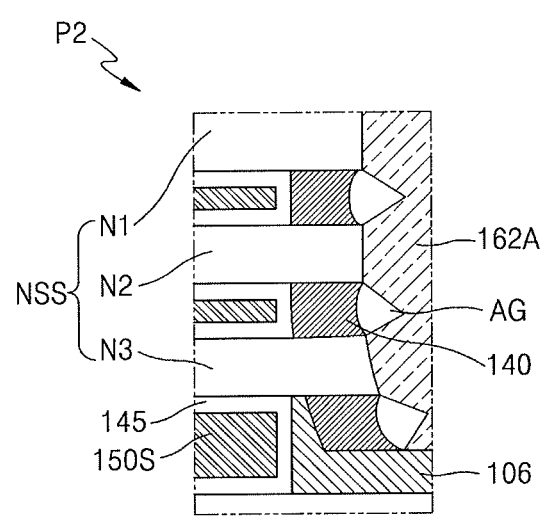
Figure 24K:
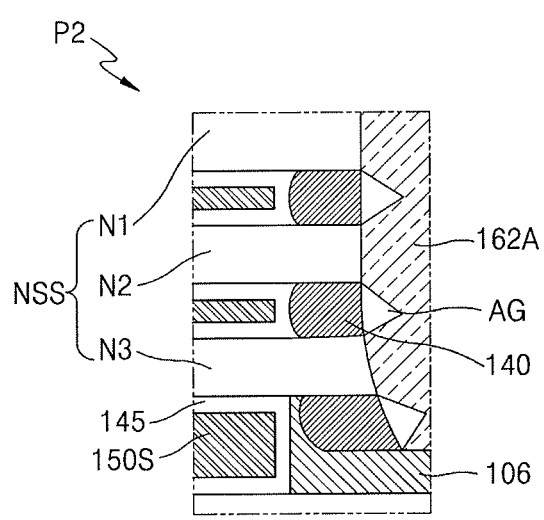
Figure 24L:
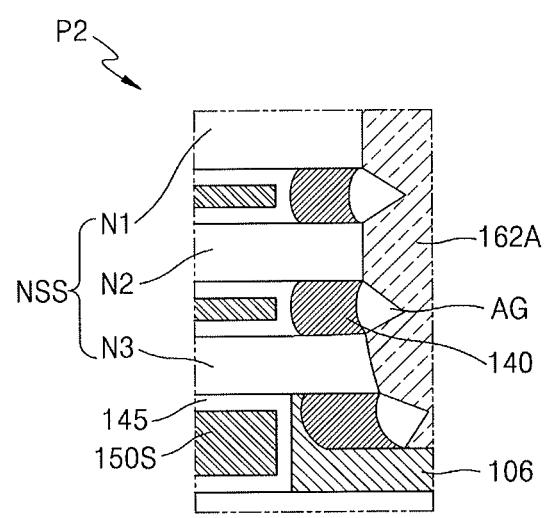
Figure 24M:
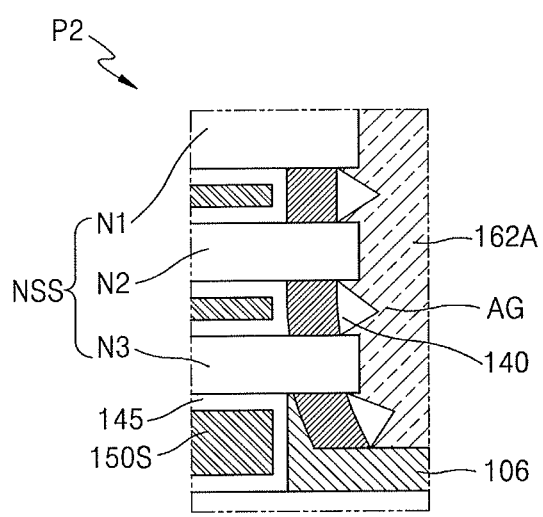
Figure 24N:
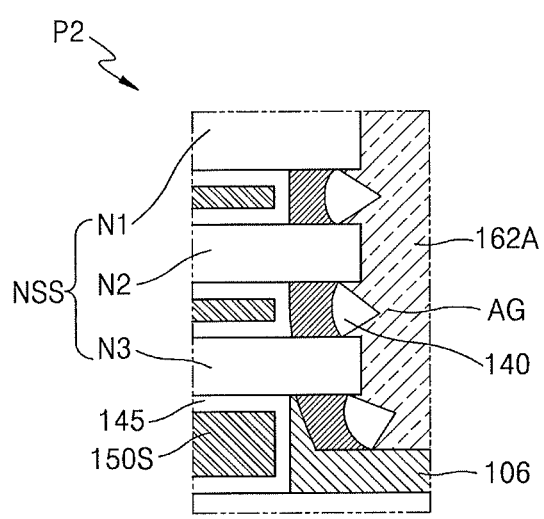
Figure 24O:
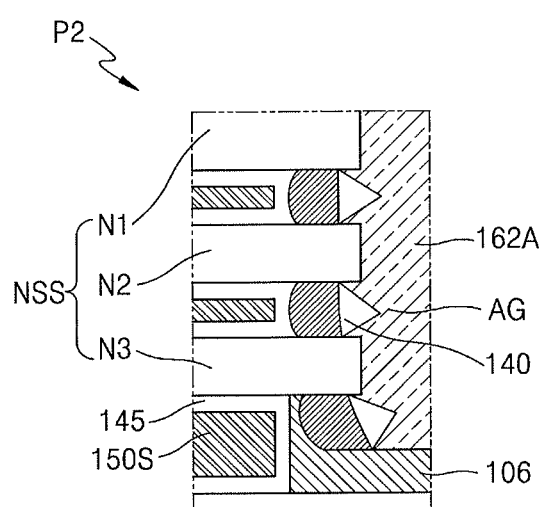
Figure 24P:
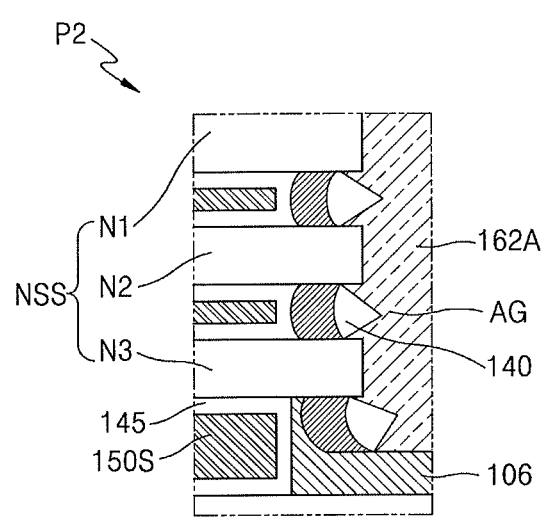
Figure 24Q:
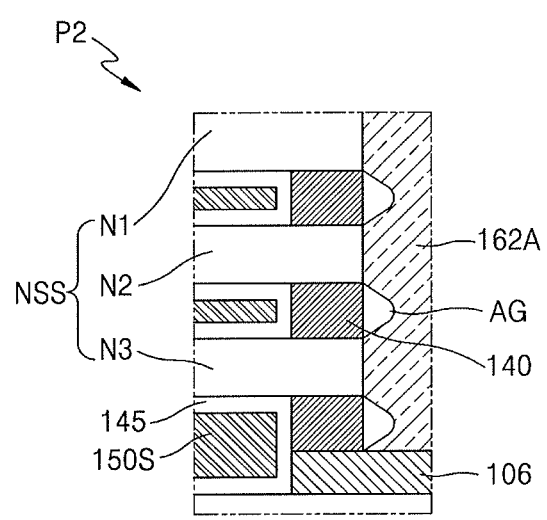

FIGS. 24A through 24Q are cross-sectional views of configurations of various air spacers that are employable in a semiconductor device according to example embodiments, by expanding a portion corresponding to an area P2 of FIG. 23.

Referring to FIG. 24A, the air spacers AG may extend from the second insulating spacers 140 to the first semiconductor layer 162A that is opposite to the sub-gate portions 150S while their heights in a vertical direction (Z-direction) of the major surface of the substrate 102 (of FIG. 23) are reduced. Each of the air spacers AG may have a triangle-shaped cross section having vertices on an upper portion and a lower portion of the side surface of the second insulating spacer 140 and in the first semiconductor layer 162A.

Each of the air spacers AG disposed between each of the second insulating spacers 140 and the first semiconductor layer 162A may have a cross-sectional area similar to each other on an X-Z plane of the major surface of the substrate 102 (of FIG. 23), but is not limited thereto.

In some embodiments, a cross-sectional area of at least one of the air spacers AG disposed between each of the second insulating spacers 140 and the first semiconductor layer 162A may be different from those of other air spacers AG disposed at different levels on the X-Z plane of the major surface of the substrate 102. On the X-Z plane, each size of cross-sectional areas of the plurality of air spacers AG may be proportional to each vertical height of the corresponding second insulating spacers 140 in Z-direction. For example, when a vertical height of a lowest second insulating spacer 140 among the plurality of second insulating spacers 140 is less than vertical heights of the other second insulating spacers 140, a cross-sectional area of a lowest air spacer AG among the plurality of air spacers AG may be less than cross-sectional areas of the other air spacers AG. Therefore, a volume of the lowest air spacer AG among the plurality of air spacers AG may be less than a volume of the other air spacers AG.

The vertical height of the lowest second insulating spacer 140 among the plurality of second insulating spacers 140 may be determined according to a height of the sacrificial semiconductor layer 106S that is the lowest layer among the plurality of sacrificial semiconductor layers 106S, wherein the height of the sacrificial semiconductor layer 106S is a height of the left part of the sacrificial semiconductor layer 106S during the isotropic etching process. Therefore, in some embodiments, the cross-sectional area of the lowest air spacer AG among the plurality of air spacers AG may be greater than the cross-sectional areas of the other air spacers AG.

Referring to FIG. 24B, the air spacers AG may extend from the second insulating spacers 140 to the first semiconductor layer 162A that is opposite to the sub-gate portions 150S while their widths are reduced. Each of the air spacers AG may have a fan-shaped cross section or a triangle-shaped cross section having a convex-shaped side in a direction of the second insulating spacers 140 and having a vertex in the first semiconductor layer 162A.

During the process of removing a part of the insulating structure 140L (see FIG. 11) to form the second insulating spacers 140 of FIG. 12, each of outer sidewalls of the second insulating spacers 140 may have a concave shape when the insulating structure 140L is relatively over-etched. The air spacers AG may project toward the second insulating spacers 140.

Referring to FIG. 24C, the second insulating spacer 140 may have a convex sidewall in a direction of the sub-gate portions 150S.

During the isotropic etching process for forming the recess regions 106R of FIG. 10, sidewalls of the plurality of sacrificial semiconductor layers 106S may be concaved inward. Therefore, the recess regions 106R may have convex shapes in a direction of the sacrificial semiconductor layers 106S. The second insulating spacers 140 formed in the recess regions 106R may have convex sidewalls toward the sub-gate portions 150S.

Referring to FIG. 24D, during the isotropic etching process for forming the recess regions 106R of FIG. 10, sidewalls of the plurality of sacrificial semiconductor layers 106S may be concaved inward. Therefore, the recess regions 106R may have convex shapes in a direction of the sacrificial semiconductor layers 106S.

Furthermore, during the process of removing a part of the insulating structure 140L (see FIG. 11) to form the second insulating spacers 140 of FIG. 12, each of outer sidewalls of the second insulating spacers 140 may have a concave shape when the insulating structure 140L is relatively over-etched.

Inner sidewalls of the second insulating spacers 140 may have convex shapes toward the sub-gate portions 150S, and outer sidewalls of the second insulating spacers 140 may have concave shapes, for example, crescent shapes, toward the air spacers AG.

Therefore, each of the air spacers AG may have a fan-shaped cross section or a triangle-shaped cross section having a convex-shaped side in a direction of the second insulating spacers 140 and having a vertex in the first semiconductor layer 162A.

Referring to FIGS. 24E through 24H, outer sidewalls of the second insulating spacers 140 toward the gaps AG may be formed to be shifted inward from both sidewalls of the nanosheets N1, N2, and N3. For example, although a shape of each of the second insulating spacers 140 of FIGS. 24E through 24H is similar to a shape of each of the second insulating spacers 140 of FIGS. 24A through 24D, the second insulating spacers 140 may be formed to be shifted inward from both sidewalls of the nanosheets N1, N2, and N3.

In more detail, during the process of removing a part of the insulating structure 140L (see FIG. 11) to form the second insulating spacers 140 of FIG. 12, the outer sidewalls of the second insulating spacers 140 may be shifted inward from the both sidewalls of the nanosheets N1, N2, and N3 by relatively over-etching the insulating structure 140L, and thus, the second insulating spacers 140 of FIGS. 24E through 24H may be formed. Since a method of forming the shapes of the second insulating spacers 140 of FIGS. 24E through 24H is similar to that of forming the shapes of the second insulating spacers 140 of FIGS. 24A through 24D, detailed description thereof will not be given here.

Furthermore, since shapes of the air spacers AG of FIGS. 24E through 24H are similar to those of the air spacers AG of FIGS. 24A through 24D except being shifted between the nanosheets N1, N2, and N3, that is, toward the sub-gate portions 150S, detailed description thereof will not be given here.

Referring to FIGS. 24I through 24P, shapes of the second insulating spacer 140 and air spacers AG may be different from one another according to a distance from the major surface of the substrate 102.

In order to form the plurality of nanosheet stack structures NSS including the nanosheets N1, N2, and N3 of FIG. 9, in the process of removing a part of the stack structure of the sacrificial semiconductor layers 106S and the nanosheet semiconductor layers NS by etching, widths of the nanosheet stack structures NSS may be wider as being close to the substrate 102. Therefore, sides of the second insulating spacers 140 may be more vertical with respect to the substrate 102 based on distances between the second insulating spacers 140 and the substrate 102. For example, sides of the second insulating spacer 140 relatively farther from the substrate 102 may be vertical with respect to the substrate 102, and sides of the second insulating spacer 140 relatively closer to the substrate 102 may be inclined with respect to the substrate 102.

Furthermore, a cross-section of the air spacer AG relatively far from the substrate 102 may have an isosceles triangle shape with two sides contacting the first semiconductor layer 162A and being equal in length, but the air spacer AG relatively near to the substrate 102 may have a triangle shape with two sides contacting the first semiconductor layer 162A and being different in length. In some embodiments, a ratio of lengths of two sides contacting the first semiconductor layers 162A of the air spacers AG may increase as being relatively near to the substrate 102. In some embodiments, a length of a side toward the substrate 102, among the lengths of two sides contacting the first semiconductor layers 162A of the air spacers AG relatively near to the substrate 102, may have a relatively small value.

Since the shapes of the both sidewalls of the second insulating spacers 140 and the air spacers AG of FIGS. 24I through 24P are similar to the shapes of the both sidewalls of the second insulating spacers 140 and the air spacers AG of FIGS. 24A through 24H except for the differences described above, detailed description thereof will not be given here.

Referring to FIG. 24Q, vertices of the air spacers AG extending to opposite sides of the second insulating spacers 140, that is, extending in the first semiconductor layers 162A, may have round shapes.

Figure 15A:
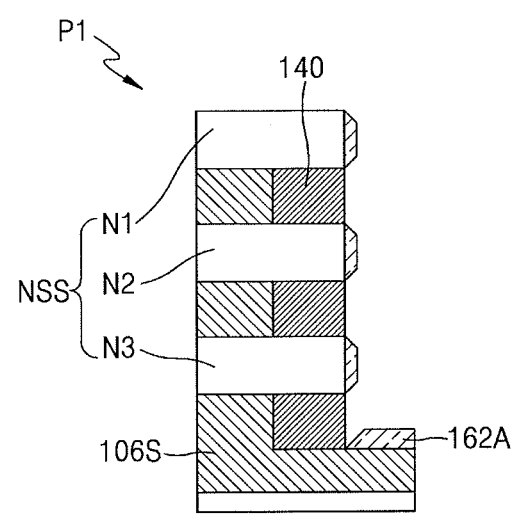
Figure 15B:
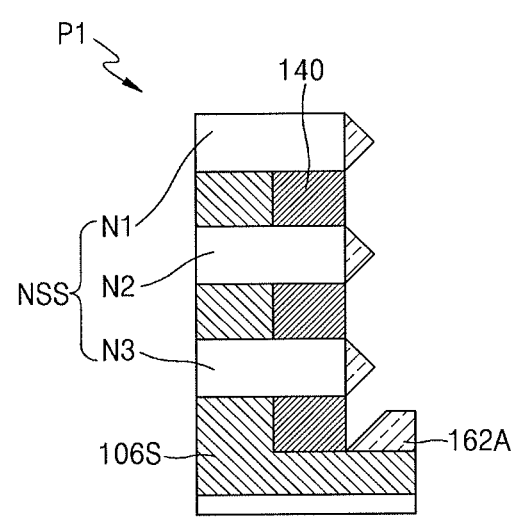
Figure 15C:
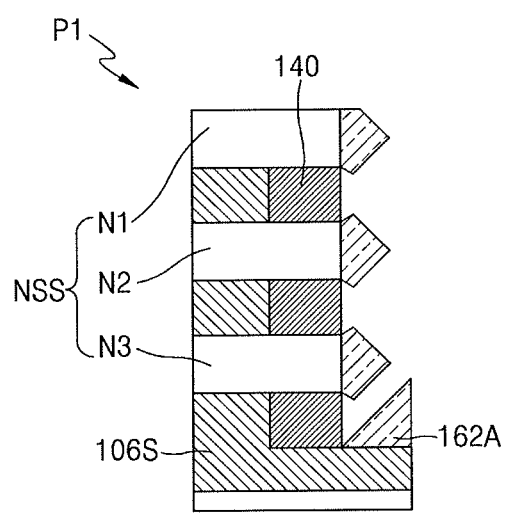
Figure 15D:
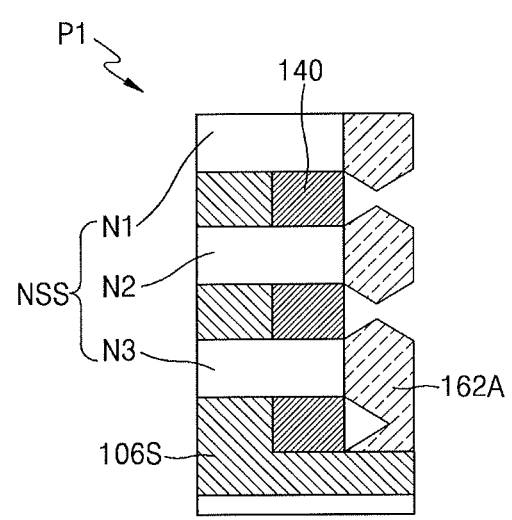
Figure 15E:
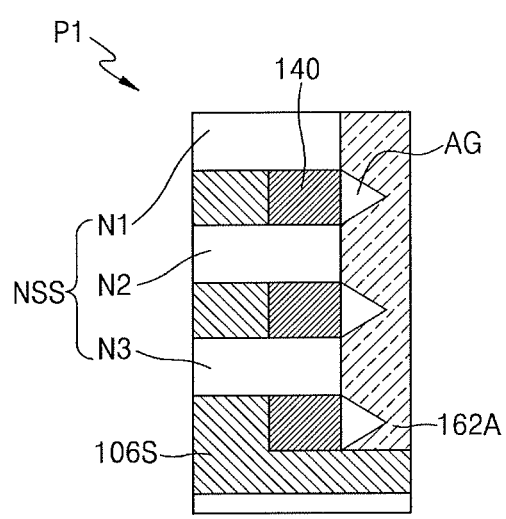

In the epitaxial growth process for forming the first semiconductor layers 162A of FIGS. 14 through 15E, the vertices of the air spacers AG extending in the first semiconductor layers 162A may have round shapes by adjusting temperature and pressure.

FIG. 24Q illustratively shows a vertex of the air spacer AG of FIG. 24A having a round shape, but it is also possible to form a vertex of the air spacers AG of FIGS. 24B through 24P having a round shape, and therefore, detailed descriptions thereof will not be given here.

Furthermore, it is to be understood by those of ordinary skilled in the art that shapes of the second insulating spacers 140 formed in the second region R2 are similar to those of the second insulating spacers 140 in FIGS. 24B through 24P, and therefore, detailed descriptions thereof will not be given here. In more detail, if all of the parts corresponding to the first semiconductor layers 162A and the air spacers AG is replaced by the second semiconductor layers 164A, FIGS. 24B through 24P may be cross-sectional views showing shapes of the second insulating spacers 140 in the second region R2.

Figure 25A:
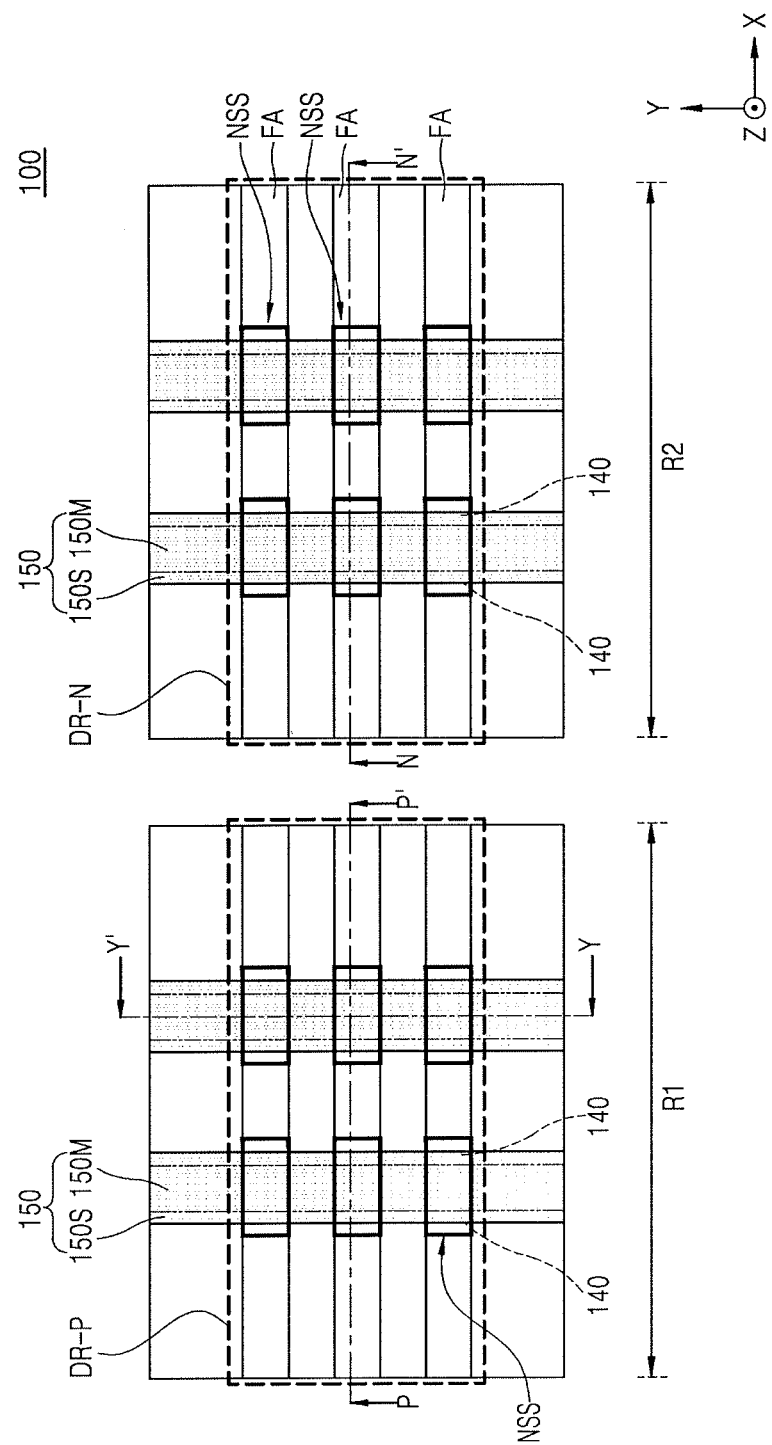
FIGS. 25A through 25C illustrate views for describing a semiconductor device according to example embodiments.
Figure 25B:
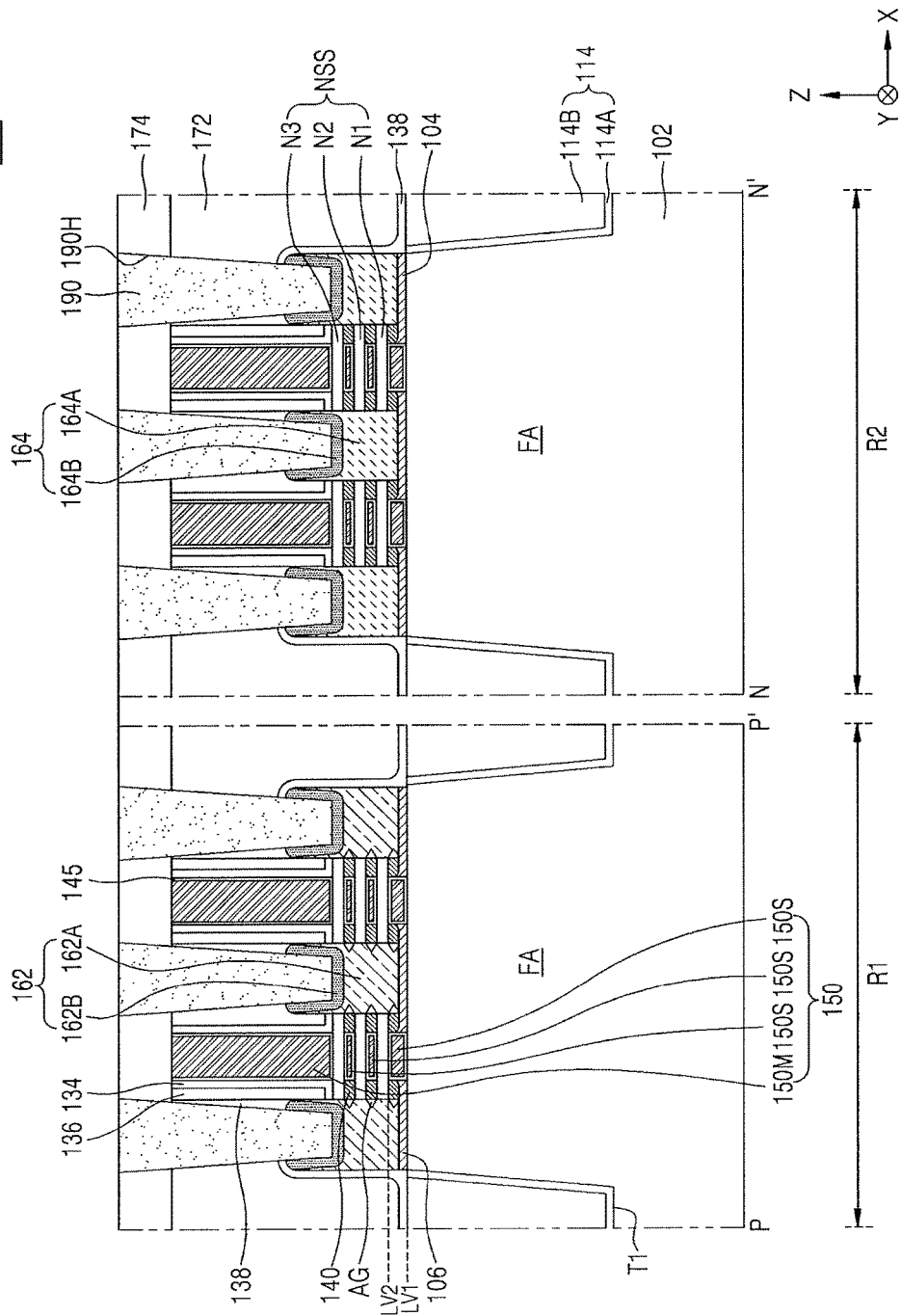
Figure 25C:
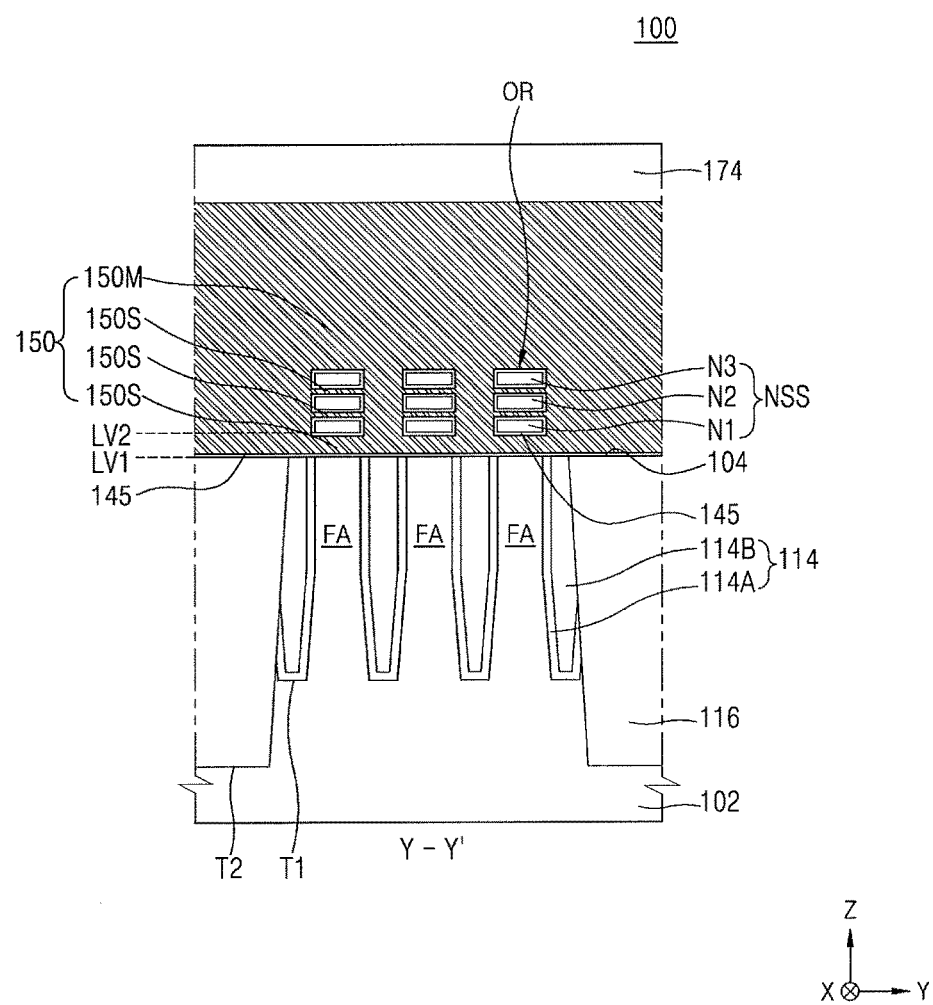

FIGS. 25A through 25C are views for describing a semiconductor device according to example embodiments, wherein FIG. 25A is a planar layout diagram of the semiconductor device, FIG. 25B is a cross-sectional view taken along lines P-P' and N-N' of FIG. 25A, and FIG. 25C is a cross-sectional view taken along a line Y-Y' of FIG. 25A. In FIGS. 25A through 25C, like reference numerals in FIGS. 1 through 24Q denote like elements, and therefore, detailed descriptions thereof will not be given here.

Referring to FIGS. 25A through 25C, after an interlayer insulating layer 174 covering the gates 150 and the inter-gate insulating layer 172 is formed, a plurality of contact holes 190H exposing the plurality of first semiconductor layers 162A and the plurality of second semiconductor layers 164A may be respectively formed in the first and second regions R1 and R2 by partially etching the interlayer insulating layer 174 and the inter-gate insulating layer 172. Next, the first source and drain regions 162 including the first semiconductor layer 162A and the first metal silicide layer 162B formed on the first semiconductor layer 162A may be formed in the first region R1, and the second source and drain region 164 including the second semiconductor layer 164A and the second metal silicide layer 164B formed on the second semiconductor layer 164A may be formed in the second region R2, by respectively forming the first and second metal silicide layers 162B and 164B on the first and second semiconductor layers 162A and 164A exposed through the plurality of contact holes 190H. Next, the semiconductor device 100 may be formed by forming a plurality of contact plugs 190 filling the contact holes 190H. The contact plug 190 may be connected to the first semiconductor layer 162A through the first metal silicide layer 162B in the first region R1, and may be connected to the second semiconductor layer 164A through the second metal silicide layer 164B in the second region R2.

The semiconductor device 100 may include a plurality of fin type active areas FA protruding from a substrate 102 and extending in a first direction (X direction) and a plurality of nanosheet stack structures NSS spaced apart from the upper surface 104 of the plurality of fin type active areas FA and facing an upper surface 104 of the plurality of fin type active areas FA.

A first trench T1 defining the plurality of fin type active areas FA and a second trench T2 defining a device region DR may be formed in the substrate 102. The second trench T2 may be deeper than the first trench T1.

Lower side walls of the plurality of fin type active areas FA may be covered by an STI layer 114 filling the first trench T1. The STI layer 114 may include an insulating liner 114A conformally covering an inner wall of the first trench T1 and a gap-fill insulating layer 114B filling the first trench T1 on the insulating liner 114A. The second trench T2 may be filled with a device isolation layer 116. A level of the upper surface 104 of the plurality of fin type active areas FA, a level of an upper surface of the STI layer 114, and a level of an upper surface of the device isolation layer 116 may be the same as or similar to one another.

The plurality of gates 150 may extend in a second direction (Y direction) crossing the first direction on the plurality of fin type active areas FA. The upper surface 104 of the plurality of fin type active areas FA may have a first level LV1.

The plurality of nanosheet stack structures NSS may be spaced apart from the upper surface 104 of the plurality of fin type active areas FA. The plurality of nanosheet stack structures NSS may include the nanosheets N1, N2, and N3 extending parallel to the upper surface 104 of the fin type active areas FA at a second level LV2 farther than the first level LV1 from the substrate 102. The present example describes the configuration in which the plurality of nanosheet stack structures NSS and the plurality of gates 150 are formed on the single fin type active area FA, and the plurality of nanosheet stack structures NSS are arranged on the single fin type active area FA in a line along an extending direction (X direction) of the fin type active area FA but the inventive concept is not limited thereto. The number of the nanosheet stack structures NSS arranged on the single fin type active area FA is not particularly limited. For example, the single nanosheet stack structure NSS may be formed on the single fin type active area FA.

The nanosheets N1, N2, and N3 constituting the plurality of nanosheet stack structures NSS may be sequentially stacked on the upper surface 104 of the plurality of fin type active areas FA one by one. The present example describes a case where the single nanosheet stack structure NSS includes the three nanosheets N1, N2, and N3 but the inventive concept is not limited thereto. For example, each of the three nanosheets N1, N2, and N3 may include one nanosheet, and may include a plurality of nanosheets that are variously selected if necessary. Each of the nanosheets N1, N2, and N3 may include a channel region.

The plurality of gates 150 may be formed to surround at least some of the nanosheets N1, N2, and N3 while covering the nanosheet stack structures NSS. Each of the plurality of gates 150 may include a main gate portion 150M covering an upper surface of the nanosheet stack structures NSS and a plurality of sub-gate portions 150S formed in a space between the fin type active areas FA and the nanosheets N1, N2, and N3, that is, under the nanosheets N1, N2, and N3. A thickness of each of the plurality of sub-gate portions 150S may be smaller than a thickness of the main gate portion 150M. Furthermore, a thickness of a lowest sub-gate portion 150S among the plurality of sub-gate portions 150S may be greater than that of remaining sub-gate portions 150S. In this regard, the thicknesses of the plurality of sub-gate portions 150S and the thickness of the main gate portion 150M refer to thicknesses in Z-direction in FIGS. 25A through 25C.

A length of each of the sub-gate portions 150S may be the same as that of the main gate portion 150M. In some embodiments, the length of each of the sub-gate portions 150S in a horizontal direction may be greater or less than that of the main gate portion 150M in a horizontal direction. In this regard, the lengths of the plurality of sub-gate portions 150S and the length of the main gate portion 150M refer to thicknesses in the X direction in FIGS. 25A through 25C, respectively.

The gate dielectric layer 145 may be formed between the nanosheet stack structures NSS and the gates 150.

The nanosheets N1, N2, and N3 may be formed in an overlap region OR covered by the gates 150 in spaces between the fin type active areas FA and the gates 150. In an X-Y plane, the nanosheet stack structures NSS including the nanosheets N1, N2, and N3 may have a larger plane area than a plane area of the overlap region OR. FIG. 25A shows a case where plane shapes of the nanosheet stack structures NSS are approximately rectangular shapes but the inventive concept is not limited thereto. The nanosheet stack structures NSS may have various plane shapes according to plane shapes of the fin type active areas FA and plane shapes of the gates 150.

In some embodiments, the nanosheets N1, N2, and N3 may include a single material. In some embodiments, the nanosheets N1, N2, and N3 may be formed of the same material as that of the substrate 102.

The gates 150 may include a layer containing metal for adjusting a work function, and a layer containing metal for filling a gap formed on an upper portion of the layer containing metal for adjusting the work function. In some embodiments, the gates 150 may have a structure in which a metal nitride layer, a metal layer, a conductive capping layer, and a gap-fill metal layer are sequentially stacked. Since the configuration of the gates 150 is the same as that of the gate forming conductive layer 150L, repeated descriptions thereof will not be given here.

In the first and second regions R1 and R2, the plurality of first source and drain regions 162 and the plurality of second source and drain regions 164 may be formed on the fin type active areas FA, respectively. The first source and drain regions 162 and the second source and drain regions 164 may be connected to ends of the neighboring nanosheets N1, N2, and N3, respectively.

The first source and drain regions 162 and the second source and drain regions 164 may include the first and second semiconductor layers 162A and 164A that are epitaxially grown from the nanosheets N1, N2, and N3, respectively. The first source and drain regions 162 may have an embedded SiGe structure including a Ge layer that is epitaxially grown, and a plurality of SiGe layers that are epitaxially grown. The second source and drain regions 164 may have an embedded SiC structure including a Si layer that is epitaxially grown, and a SiC layer that is epitaxially grown.

The first source and drain regions 162 and the second source and drain regions 164 may further include the first metal silicide layer 162B formed on the first semiconductor layer 162A and the second metal silicide layer 164B formed on the second semiconductor layer 164A, respectively. In some embodiments, the first and second metal silicide layers 162B and 164B may include titanium silicide but the inventive concept is not limited thereto. In some embodiments, the first and second metal silicide layers 162B and 164B may be omitted.

Insulating liners 134, first insulating spacers 136, and protection layers 138 that sequentially cover sidewalls of the gates 150 may be formed on the plurality of nanosheet stack structures NSS. The protection layers 138 may extend to cover the plurality of first and second source and drain regions 162. The insulating liners 134, the first insulating spacers 136, and the protection layers 138 may include silicon nitride layers but are not limited thereto. In some embodiments, the protection layers 138 may be omitted.

The insulating liners 134, the first insulating spacers 136, and the protection layers 138 may cover a sidewall of the main gate portion 150M included in the gates 150.

In each of the first and second regions R1 and R2, the second insulating spacers 140 contacting the first and second source and drain regions 162 and 164 may be formed in spaces between the nanosheets N1, N2, and N3, respectively. The second insulating spacers 140 may be disposed between the sub-gate portions 150S and the first source and drain regions 162 and between the sub-gate portions 150S and the second source and drain regions 164 in the spaces between the nanosheets N1, N2, and N3, respectively. In some embodiments, the second insulating spacers 140 may include a silicon nitride layer. The second insulating spacers 140 may cover sidewalls of at least some of the plurality of sub-gate portions 150S. As illustrated in FIG. 25B, both side walls of the sub-gate portion 150S closest to the fin type active areas FA among the three sub-gate portions 150S may be covered by a buffer semiconductor layer 106 covering the upper surface 104 of the fin type active areas FA. In some embodiments, some of the buffer semiconductor layer 106 may be disposed between the second insulating spacers 140 and the sub-gate portions 150S corresponding to the sub-gate portion 150S closest to the fin type active areas FA among the three sub-gate portions 150S.

The buffer semiconductor layer 106 may include a material different from materials of the fin type active areas FA and the nanosheets N1, N2, and N3. For example, the fin type active areas FA may include Si, and the buffer semiconductor layer 106 may include Ge.

In some embodiments, the first and second insulating spacers 136 and 140 may include an insulating layer in which seeding and epitaxial growth of a semiconductor atom are impossible on their surface.

In the first region R1, a plurality of air spacers AG may be formed between each of the second insulating spacers 140 and the first semiconductor layer 162A. The air spacers AG may extend from the second insulating spacers 140 to inside the first semiconductor layer 162A that is opposite to the sub-gate portions 150S while their widths are reduced. Shapes of the air spacers AG may vary as illustrated in FIGS. 24A through 24Q.

In some embodiments, each of the air spacers AG may have a triangle-shaped cross section, a fan-shaped cross section, or a triangle-shaped cross section having a convex-shaped side on the X-Z plane. In some embodiments, some of the air spacers AG may extend between the nanosheets N1, N2, and N3 and the fin type active areas FA. In some embodiments, vertices of the air spacers AG extending in the first semiconductor layer 162A may have round shapes.

Each of the air spacers AG disposed between each of the second insulating spacers 140 and the first semiconductor layer 162A may have a cross-sectional area similar to each other on an X-Z plane of the major surface of the substrate 102, but is not limited thereto.

In some embodiments, at least one of the air spacers AG disposed between each of the second insulating spacers 140 and the first semiconductor layer 162A may have a cross-sectional area different from those of the other air spacers AG on the X-Z plane. For example, a cross-sectional area of the lowest air spacer AG among the plurality of air spacers AG may be less than those of the other air spacers AG. In some embodiments, the cross-sectional area of the lowest air spacer AG among the plurality of air spacers AG may be greater than the cross-sectional areas of the other air spacers AG.

In the second region R2, a plurality of air spacers AG may not be formed between each of the second insulating spacers 140 and the second semiconductor layer 164A. For example, the second semiconductor layer 164A may completely cover a surface of a sidewall of the plurality of second insulating spacers 140 opposite the sub-gate portions 150S.

Referring again to FIGS. 25A through 25C, the inter-gate insulating layer 172 and the interlayer insulating layer 174 may be sequentially formed on the plurality of first source and drain regions 162 and the plurality of second source and drain regions 164. The inter-gate insulating layer 172 and the interlayer insulating layer 174 may include a silicon nitride layer but are not limited thereto.

The contact plug 190 may be connected to each of the first and second source and drain regions 162 and 164. The contact plug 190 may pass through the interlayer insulating layer 174, the inter-gate insulating layer 172, and the protection layer 138 and may be connected to each of the first and second source and drain regions 162 and 164. The first metal silicide layer 162B may be disposed between the first semiconductor layer 162A and the contact plug 190. The second metal silicide layer 164B may be disposed between the second semiconductor layer 164A and the contact plug 190. The contact plug 190 may include metal, conductive metal nitride, or a combination thereof. For example, the contact plug 190 may include W, copper (Cu), Al, Ti, tantalum (Ta), TiN, TaN, an alloy thereof, or a combination thereof, but the inventive concept is not limited to the above materials.

The semiconductor device 100 described with reference to FIGS. 1 through 25C, may include the plurality of second insulating spacers 140 respectively contacting the first and second source and drain regions 162 and 164 in spaces between the nanosheets N1, N2, and N3 formed on the fin type active areas FA. Furthermore, in the first region R1, a plurality of air spacers AG may be formed between each of the second insulating spacers 140 and the first semiconductor layer 162A of the first source and drain regions 162.

Therefore, the semiconductor device 100 may reduce parasitic capacitance in the first region R1 by the second insulating spacers 140 and the air spacers AG, and may reduce parasitic capacitance in the second region R2 by the second insulating spacers 140, and thus, characteristics of the semiconductor device 100 may improve.

Furthermore, when the first region R1 includes PMOS and the second region R2 includes NMOS, characteristics of the PMOS in the first region R1 may be adjusted by the second insulating spacers 140 and the air spacers AG, and characteristics of the NMOS in the second region R2 may be adjusted by the second insulating spacers. Therefore, it is possible to improve characteristics of a CMOS device by the PMOS in the first region R1 and the characteristics of the NMOS in the second region R2 by minimizing a difference in the characteristics of the PMOS and the NMOS.

Furthermore, since each of the first and second semiconductor layers 162A and 164A is not grown from the second insulating spacers 140, crystallinity of the first and second semiconductor layers 162A and 164A may improve. Therefore, resistance of the first and second source and drain regions 162 and 164 may be reduced and efficiency as a stressor may improve.

Figure 26:
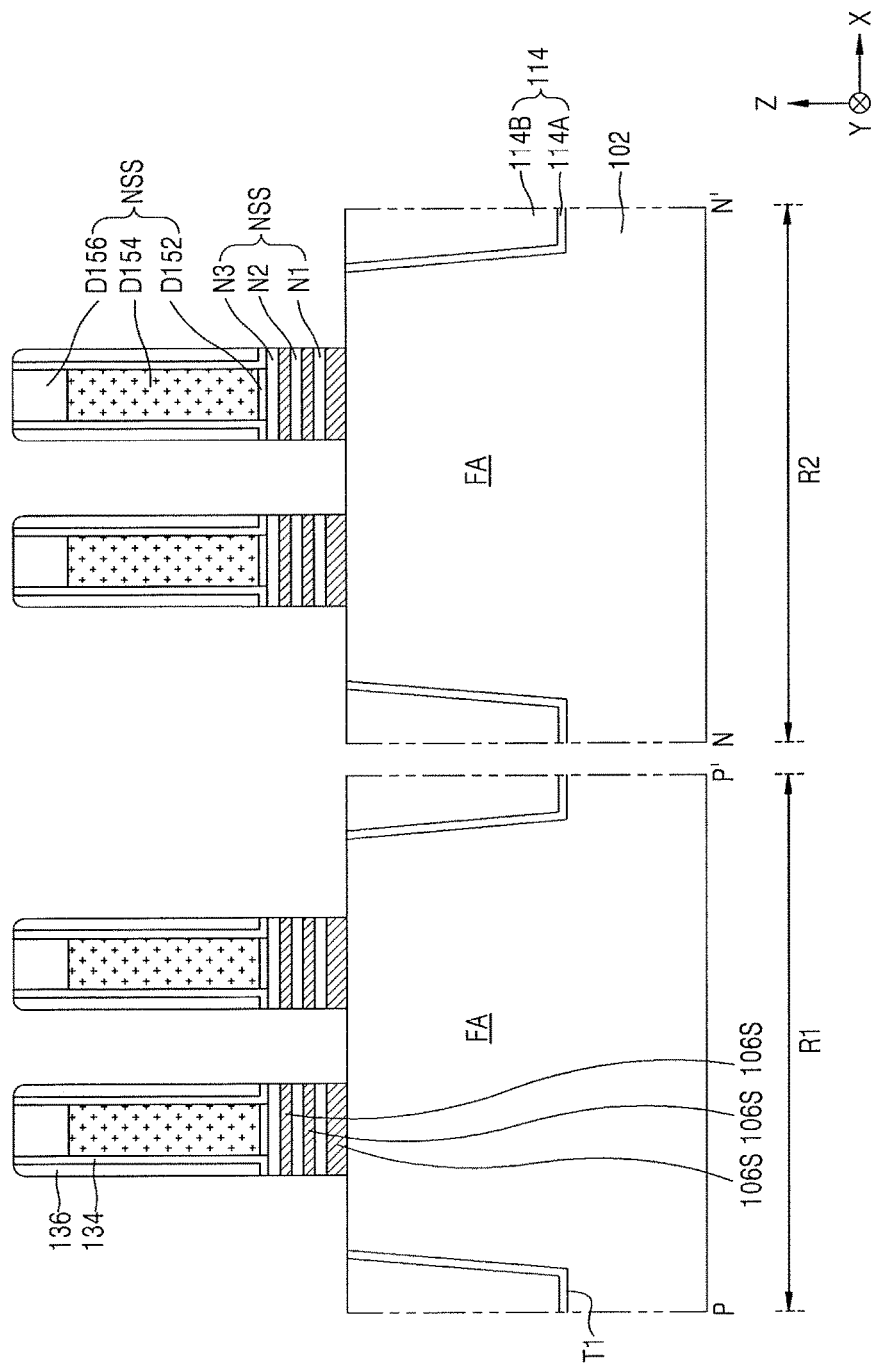
FIGS. 26 and 27A illustrate cross-sectional views for describing a semiconductor device and a method of manufacturing the same according to example embodiments.
Figure 27A:
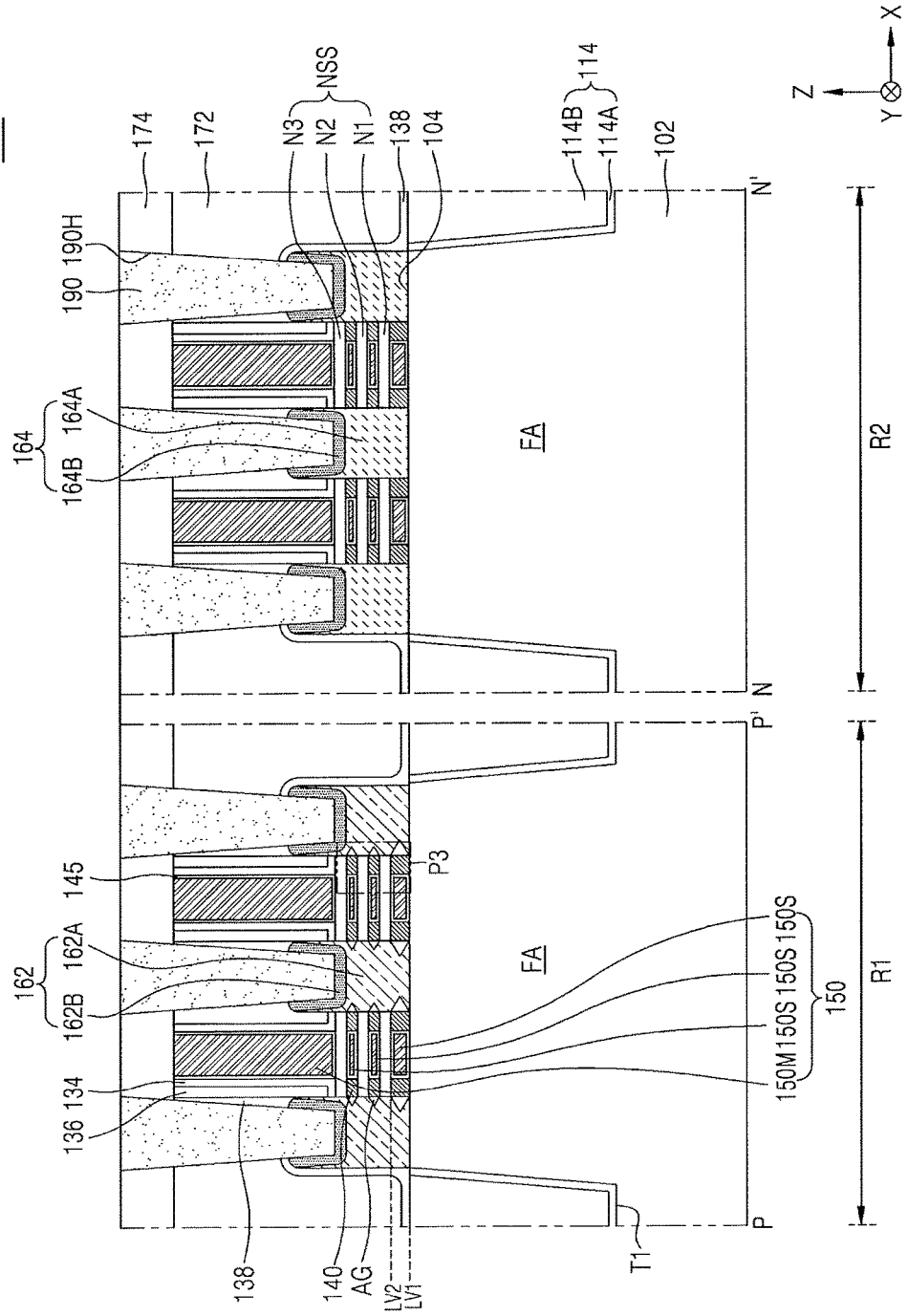
Figure 27B:
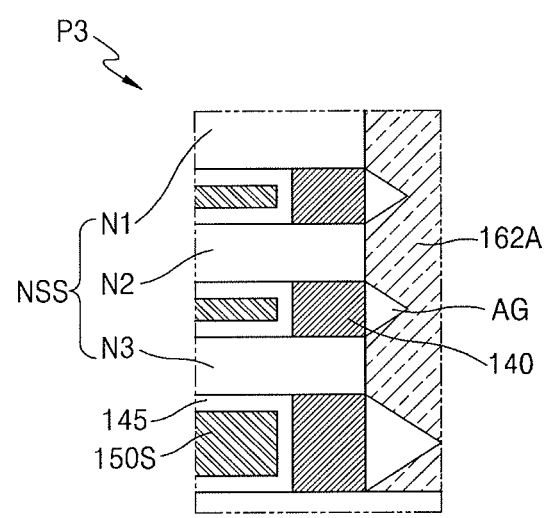
FIG. 27B illustrates an enlarged cross-sectional view of a configuration of an air spacer employed in a semiconductor device.

FIGS. 26 and 27A are cross-sectional views for describing a semiconductor device and a method of manufacturing the same according to example embodiments, and FIG. 27B is an enlarged cross-sectional view of a configuration of an air spacer employed in a semiconductor device.

Referring to FIG. 26, the plurality of nanosheet stack structures NSS including the nanosheets N1, N2, and N3 may be formed on the fin type active areas FA by performing processes described with reference to FIGS. 1 through 9.

However, unlike the process described with reference to FIG. 9, an etching process may be performed until when an upper surface of the fin type active areas FA is exposed when etching the stack structure of the sacrificial semiconductor layers 106S and the nanosheet semiconductor layers NS. Therefore, after the nanosheet stack structures NSS are formed, the fin type active areas FA may be exposed between the nanosheet stack structures NSS.

Referring to FIGS. 27A and 27B, processes described with reference to FIGS. 10 through 23 may be performed on a resultant of FIG. 26 to form a semiconductor device 200.

The semiconductor device 200 may include the plurality of second insulating spacers 140 respectively contacting the first and second source and drain regions 162 and 164 in spaces between the nanosheets N1, N2, and N3 formed on the fin type active areas FA, and may include the plurality of air spacers AG between each of the second insulating spacers 140 and the first semiconductor layer 162A of the first source and drain regions 162, in the first region R1.

The air spacers AG may extend from the second insulating spacers 140 to inside the first semiconductor layer 162A that is opposite to the sub-gate portions 150S while their widths are reduced. Each of the air spacers AG may have a triangle-shaped cross section having vertices on an upper portion and a lower portion of the side surface of the second insulating spacer 140 and in the first semiconductor layer 162A.

At least one of the air spacers AG disposed between each of the second insulating spacers 140 and the first semiconductor layer 162A may have a cross-sectional area different from those of the other air spacers AG on the X-Z plane. On the X-Z plane, each size of cross-sectional areas of the plurality of air spacers AG may be proportional to each vertical height of the corresponding second insulating spacers 140 in Z-direction. For example, when a vertical height of the lowest second insulating spacer 140 among the plurality of second insulating spacers 140 is greater than vertical heights of the other second insulating spacers 140, a cross-sectional area of the lowest air spacer AG among the plurality of air spacers AG may be greater than cross-sectional areas of the other air spacers AG. Therefore, a volume of the lowest air spacer AG among the plurality of air spacers AG may be greater than a volume of the other air spacers AG.

Furthermore, it is to be understood by those of ordinary skilled in the art that shapes of the air spacers AG and the second insulating spacers 140 included in the semiconductor device 200 are also similar to those of the air spacers AG and the second insulating spacers 140 in FIGS. 24B through 24P, and therefore, detailed descriptions thereof will not be given here.

Although the semiconductor devices including transistors having nanosheet channel regions formed on three-dimensional structure fin type active areas and methods of manufacturing the semiconductor devices are described with reference to FIGS. 1 through 27B, but the example embodiments are not limited thereto. For example, it will be obvious to those of ordinary skill in the art that integrated circuit devices including planar metal-oxide-semiconductor field effect transistors (MOSFETs) having characteristics of the example embodiments and methods of manufacturing the integrated circuit devices may be provided through various modifications and changes within the scope of the inventive concept.

Figure 28:
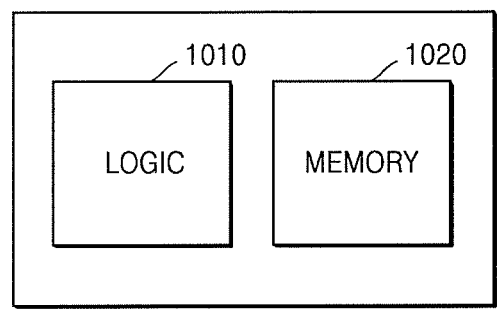
FIG. 28 illustrates a block diagram of an electronic device according to example embodiments.

FIG. 28 is a block diagram of an electronic device 1000 according to example embodiments.

Referring to FIG. 28, the electronic device 1000 may include a logic area 1010 and a memory area 1020.

The logic area 1010 may include various kinds of logic cells including a plurality of circuit elements such as transistors, registers, etc., as standard cells performing desired logic functions such as a counter, a buffer, etc. The logic cell may configure, e.g., AND, NAND, OR, NOR, XOR (exclusive OR), XNOR (exclusive NOR), INV (inverter), ADD (adder), BUF (buffer), DLY (delay), FILL (filter), multiplexer (MXT/MXIT), OAI (OR/AND/INVERTER), AO (AND/OR), AOI (AND/OR/INVERTER), D flip-flop, reset flip-flop, master-slaver flip-flop, latch, etc. However, the logic cells according to the example embodiments are not limited to the above examples.

The memory area 1020 may include at least one of static random access memory (SRAM), dynamic random access memory (DRAM), magnetic random access memory (MRAM), resistive random access memory (RRAM), and phase-change random access memory (PRAM).

The logic area 1010 may include at least one of the semiconductor devices 100 and 200 illustrated in FIGS. 1 through 27B and other semiconductor devices having various structures modified and changed from the above semiconductor devices 100 and 200 within the scope of the inventive concept. For example, at least a part of various logic cells included in the logic area 1010 may include a CMOS device by PMOS and NMOS that is formed in each of the first and second regions R1 and R2 of the semiconductor devices 100 and 200. Therefore, since the at least a part of various logic cells included in the logic area 1010 may form a CMOS having improved characteristics by minimizing a difference in characteristics of a PMOS and an NMOS, characteristics of the electronic device 1000 may improve.

By way of summation and review, to reduce parasitic resistance and parasitic capacitance in semiconductor devices and enhance performance thereof, a new method through a structural change of semiconductor devices is desired.

As described above, embodiments may provide a semiconductor device including a multigate metal-oxide-semiconductor field effect transistor (MOSFET) capable of improving performance of the semiconductor device.

According to an embodiment, a semiconductor device may reduce parasitic capacitance in a first region by an insulating spacer and an air spacer, may reduce parasitic capacitance in a second region by an insulating spacer, and may minimize a characteristics difference of a PMOS formed in the first region and an NMOS formed in the second region thereby, and thus, characteristics of a CMOS device formed by the PMOS and the NMOS may improve.

Furthermore, since a semiconductor layer including source and drain regions does not grow from the insulating spacer, crystallinity of the semiconductor layer may improve, and thus, resistance of the source and drain regions may be reduced and efficiency as a stressor may improve.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a first region and a second region;
fin type active areas extending in a first direction away from the substrate, the fin type active areas being included in each of the first and second regions;
a plurality of nanosheets extending parallel to an upper surface of the fin type active areas and being spaced apart from the upper surface of the fin type active areas, each of the nanosheets having a channel region;
a gate extending over the fin type active areas in a second direction crossing the first direction, wherein the gate surrounds at least a portion of each of the nanosheets;
a gate dielectric layer interposed between the nanosheets and the gate;
first source and drain regions included in the first region, and second source and drain regions included in the second region, the first source and drain regions and the second source and drain regions being connected to the nanosheets and respectively including materials different from one another; and
insulating spacers interposed between the fin type active areas and the nanosheets, wherein:
air spacers are interposed between the insulating spacers and the first source and drain regions in the first region,
the gate includes a main gate portion on the nanosheets, the main gate portion having a first thickness, and a plurality of sub-gate portions between the nanosheets and the fin type active areas, the sub-gate portions having a second thickness less than the first thickness, and
the insulating spacers cover sidewalls of each of the sub-gate portions, and the gate dielectric layer is interposed between the insulating spacers and the sub-gate portions.

2. The semiconductor device as claimed in claim 1, wherein, in the second region, the second source and drain regions directly contact and completely cover side surfaces of sidewalls of the insulating spacers opposite the sub-gate portions.

3. The semiconductor device as claimed in claim 1, wherein a thickness of a lowest sub-gate portion among the plurality of sub-gate portions is greater than respective thicknesses of remaining sub-gate portions.

4. The semiconductor device as claimed in claim 1, wherein a volume of an air spacer between the insulating spacer covering sidewalls of a lowest sub-gate portion among the plurality of sub-gate portions and the first source and drain regions is different from volumes of the air spacers between the insulating spacers covering sidewalls of the remaining sub-gate portions and the first source and drain regions.

5. The semiconductor device as claimed in claim 4, wherein a vertical height of the insulating spacer covering the sidewalls of the lowest sub-gate portion among the plurality of sub-gate portions is different from vertical heights of the insulating spacers covering the sidewalls of the remaining sub-gate portions.

6. The semiconductor device as claimed in claim 1, wherein the first source and drain regions include a semiconductor material including germanium (Ge), and the second source and drain regions include a semiconductor material not including Ge.

7. The semiconductor device as claimed in claim 1, wherein, in the first source and drain regions, heights of the air spacers decrease in a direction perpendicular to a major surface of the substrate.

8. The semiconductor device as claimed in claim 1, wherein the air spacers extend from the nanosheets to the fin type active areas.

9. The semiconductor device as claimed in claim 1, wherein the air spacers project toward the insulating spacers.

10. A semiconductor device, comprising:
a substrate including active areas in each of first and second regions;
at least one nanosheet stack structure facing upper surfaces of the active areas and being spaced apart from the upper surfaces of the active areas, the at least one nanosheet stack structure including a plurality of nanosheets each having a channel region;
a gate extending over the active areas in a direction crossing the active areas, the gate covering the at least one nanosheet stack structure, wherein the gate includes a main gate portion disposed over the at least one nanosheet stack structure and a plurality of sub-gate portions disposed under each of the plurality of nanosheets;
a gate dielectric layer interposed between the at least one nanosheet stack structure and the gate;
first source and drain regions included in the first region, and second source and drain regions included in the second region, the first source and drain regions and the second source and drain regions being connected to the nanosheets;
a first insulating spacer disposed on the plurality of nanosheets, the first insulating spacer covering sidewalls of the gate; and
a plurality of second insulating spacers interposed between the sub-gate portions and the first source and drain regions in spaces between the upper surfaces of the active areas and the at least one nanosheet stack structure and spaces between the plurality of nanosheets in the first region and interposed between the sub-gate portions and the second source and drain regions in spaces between the upper surfaces of the active areas and the at least one nanosheet stack structure and the spaces between the plurality of nanosheets in the second region, wherein air spacers are interposed between the second insulating spacers and the first source and drain regions in the first region, and the second insulating spacers contact the second source and drain regions in the second region.

11. The semiconductor device as claimed in claim 10, wherein:
the air spacers are respectively disposed between the second insulating spacers and the first source and drain regions, and
volumes of the air spacers differ based on distances between the air spacers and a major surface of the substrate.

12. The semiconductor device as claimed in claim 10, wherein respective lengths of the sub-gate portions are substantially equal to length of the main gate portion.

13. The semiconductor device as claimed in claim 10, wherein the first source and drain regions include germanium (Ge) or silicon-germanium (SiGe), and the second source and drain regions include silicon (Si) or silicon carbide (SiC).

14. The semiconductor device as claimed in claim 10, wherein the second source and drain regions directly contact and cover side surfaces of sidewalls of the second insulating spacers opposite the sub-gate portions, and no air spacers are between the second insulating spacers and the second source and drain regions.

15. A semiconductor device, comprising:
a substrate including a first region and a second region adjacent to each other;
a first nanosheet stack structure in the first region, and a second nanosheet stack structure in the second region, the first and second nanosheet structures each including a lowermost nanosheet coplanar with one another, a metal or metal nitride conductive layer on the lowermost nanosheet, and a second nanosheet on the conductive layer, the second nanosheet having a width greater than that of the conductive layer such that the second nanosheet overhangs the conductive layer to form a recess;
first source and drain regions disposed on opposite sides of the first nanosheet stack structure;
second source and drain regions disposed on opposite sides of the second nanosheet stack structure;
insulating spacers disposed in the recesses of the first and second nanosheet stack structures, the insulating spacers in the recesses of the second nanosheet stack structure contacting the second source and drain regions, and the insulating spacers in the recesses of the first nanosheet stack structure being separated from the first source and drain regions by an air gap.

16. The semiconductor device as claimed in claim 15, wherein the first region is a PMOS region, and the second region is an NMOS region.

17. The semiconductor device as claimed in claim 16, wherein the air gap has at least one side having an angle corresponding to a (111) crystal plane of material of the first source and drain regions.

18. The semiconductor device as claimed in claim 17, wherein the insulating spacers disposed in the recesses of the first nanosheet structure are exposed to air in the air gap.

19. The semiconductor device as claimed in claim 15, wherein the insulating spacers of the first and second nanosheet stack structures are formed of a same material, and the material of the first source and drain regions is different from the material of the second source and drain regions.

* * * * *